(12) United States Patent
Abu Hilal

(10) Patent No.: US 11,012,084 B1
(45) Date of Patent: May 18, 2021

(54) SELF-CALIBRATING SUCCESSIVE-APPROXIMATION ANALOG-TO-DIGITAL CONVERTERS

(71) Applicant: Silicon Laboratories Inc., Austin, TX (US)

(72) Inventor: Obaida Mohammed Khaled Abu Hilal, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/856,198

(22) Filed: Apr. 23, 2020

(51) Int. Cl.
| H03M 1/10 | (2006.01) |
| H03M 1/06 | (2006.01) |
| H03M 1/12 | (2006.01) |
| H03M 1/00 | (2006.01) |

(52) U.S. Cl.
CPC ....... H03M 1/1009 (2013.01); H03M 1/0604 (2013.01); *H03M 1/00* (2013.01); *H03M 1/001* (2013.01); *H03M 1/06* (2013.01); *H03M 1/12* (2013.01)

(58) Field of Classification Search
CPC ...... H03M 1/1009; H03M 1/06; H03M 1/001; H03M 1/12; H03M 1/00
USPC .......................... 341/120, 110, 155, 118, 161
See application file for complete search history.

(56) References Cited

U.S. PATENT DOCUMENTS

| 9,742,423 | B1 | 8/2017 | Abu Hilal | |
| 9,831,889 | B1 | 11/2017 | Abu Hilal | |
| 2003/0201924 | A1 | 10/2003 | Lakshmikumar | |
| 2011/0074617 | A1 | 3/2011 | Portmann | |
| 2011/0122008 | A1 | 5/2011 | Mahooti | |
| 2013/0088375 | A1* | 4/2013 | Wu | H03M 1/1052 341/120 |
| 2016/0079447 | A1 | 3/2016 | Kriebernegg | |
| 2017/0250702 | A1 | 8/2017 | Venca | |

OTHER PUBLICATIONS

Allen, P., and Holberg, D., "CMOS Analog Circuit Design," Oxford University Press, Inc., 1987, pp. 560-570.
Allen, P., and Holberg, D., "CMOS Analog Circuit Design," Oxford University Press, Inc., 1987, pp. 529-544.

* cited by examiner

*Primary Examiner* — Joseph J Lauture
(74) *Attorney, Agent, or Firm* — Zagorin Cave LLP

(57) ABSTRACT

A method for calibrating a successive-approximation analog-to-digital converter (ADC) includes configuring the successive-approximation ADC in a calibration mode of operation. The method includes, while in the calibration mode of operation: determining a digital code corresponding to a programmable capacitance of the successive-approximation analog-to-digital converter, and storing the digital code corresponding to the programmable capacitance in a storage element of an integrated circuit die including the successive-approximation ADC. The programmable capacitance may be a gain tuning capacitance, a bridge tuning capacitance, an offset capacitance, or a monotonicity tuning capacitance.

20 Claims, 16 Drawing Sheets

SELF-CALIBRATING SUCCESSIVE-APPROXIMATION ANALOG-TO-DIGITAL CONVERTERS

CROSS-REFERENCE TO RELATED APPLICATION(S)

This application is related to U.S. patent application Ser. No. 16/856,204, filed on Apr. 23, 2020, entitled "SUCCESSIVE-APPROXIMATION ANALOG-TO-DIGITAL CONVERTER GAIN CALIBRATION USING FLOATING CAPACITORS," naming Obaida Mohammed Khaled Abu Hilal as inventor, which application is hereby incorporated by reference.

This application is related to U.S. patent application Ser. No. 16/856,206, filed on Apr. 23, 2020, entitled "MONOTONICITY SELF-TESTING OF ANALOG-TO-DIGITAL CONVERTERS," naming Obaida Mohammed Khaled Abu Hilal as inventor, which application is hereby incorporated by reference.

BACKGROUND

Field of the Invention

The invention relates to integrated circuits and more particularly to data converter circuits.

Description of the Related Art

In general, an analog-to-digital converter (ADC) converts analog signals, e.g., continuous signals measured in response to changes in physical phenomena, such as sound, light, temperature, position or pressure, into digital signals, i.e., discrete-time signals that may be used to digitize analog systems or realize signal transformations that cannot be easily implemented using continuous-time systems. A typical ADC stores an input analog signal using a sample-and-hold circuit and uses a reference voltage to determine a digital word that represents the sampled input analog signal. Various different techniques can be used to convert signals with different conversion times, cost, power consumption, or accuracy. A successive-approximation ADC is a medium-speed, low cost, low power, and medium accuracy ADC that uses a digital-to-analog converter (DAC) to estimate the analog input. A typical successive-approximation ADC includes a comparator, a DAC, and digital control logic configured to convert an input analog signal into an N-bit digital word in approximately N clock cycles.

SUMMARY OF EMBODIMENTS OF THE INVENTION

In at least one embodiment, a method for calibrating a successive-approximation analog-to-digital converter (ADC) includes configuring the successive-approximation ADC in a calibration mode of operation. The method includes, while in the calibration mode of operation: determining a digital code corresponding to a programmable capacitance of the successive-approximation analog-to-digital converter, and storing the digital code corresponding to the programmable capacitance in a storage element of an integrated circuit die including the successive-approximation ADC. The method may include sampling a predetermined voltage level during a sampling phase to generate a sampled voltage. The method may include redistributing charge according to a predetermined digital code by a charge-redistribution digital-to-analog converter (DAC) to generate a scaled voltage level during a conversion phase, the predetermined digital code corresponding to an expected output of the successive-approximation ADC in response to the predetermined voltage level. The method may include comparing the sampled voltage to the scaled voltage level to generate a digital signal. The method may include using the digital signal to generate the digital code corresponding to the programmable capacitance. The programmable capacitance may be a gain tuning capacitance, a bridge tuning capacitance, an offset capacitance, or a monotonicity tuning capacitance.

In at least one embodiment, a successive-approximation ADC includes an input capacitance coupled to a first node and configured to store a sampled input charge based on an input analog signal during a first phase of an analog-to-digital conversion and a gain tuning capacitance configured to store a first portion of the sampled input charge during a second phase of the analog-to-digital conversion and to sequester the first portion during a third phase of the analog-to-digital conversion. The successive-approximation ADC includes a charge-redistribution digital-to-analog converter coupled to the first node and comprising a conversion capacitor configured to store a second portion of the sampled input charge during the second phase of the analog-to-digital conversion and configured to use the second portion, a remaining portion of the sampled input charge, and a reference voltage to provide an analog signal on the first node corresponding to a digital output code approximating the input analog signal at an end of the third phase of the analog-to-digital conversion. The successive-approximation ADC includes control logic configured to generate switch control signals to operate the successive-approximation ADC in a tuning mode to generate a gain tuning code for determining the gain tuning capacitance.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

An exemplary system receives an input analog signal in a first voltage domain (e.g., a 5.5 V voltage domain) and includes circuits operating in a second voltage domain (e.g., a 2.4 V voltage domain) that uses a lower reference voltage than the first voltage domain. An exemplary successive-approximation ADC samples the input analog signal in the first voltage domain and converts the sampled signal into a digital signal in the second voltage domain using a reference voltage that is part of the second voltage domain. In an exemplary application, the first voltage domain can have voltage levels up to 5.5 V, but a maximum voltage of the first voltage domain is limited to a reference voltage so that no input voltage division is used. For example, a maximum reference voltage is 2.4 V and the first voltage domain is limited to 2.4 V and no input voltage division is used. In other applications, when the input analog signal is not limited to the reference voltage, and can exceed the reference voltage, so the input analog signal can be as high as 5.5 V and an input DAC divides the input voltage as discussed further below.

Sampling the input analog signal in the first voltage domain requires using transistors with higher breakdown voltages, and thus larger size than the transistors used in the second voltage domain. Those transistors are associated with slower speed and larger circuits (e.g., level shifters and control logic) that increase size and power consumption. In at least one embodiment, transistors used by a sampling circuit of the successive-approximation ADC are conventional 5 V CMOS transistors that have a breakdown voltage that is just over domain voltage $V_{D1}$ (e.g., have a breakdown voltage in a range greater than 5.5 V) and gate-to-source voltages and drain-to-source voltages are maintained within reliability and performance limits determined by gate oxide thicknesses of the transistors (e.g., $V_{GS}$<6 V and $V_{DS}$<6 V). Transistors used by a conversion circuit of the successive-approximation ADC are conventional 3 V CMOS transistors that have a breakdown voltage that is just over reference voltage $V_{D2}$ (e.g., have a breakdown voltage in a range greater than 2.4 V) and gate-to-source voltages and drain-to-source voltages are maintained within reliability and performance limits determined by gate oxide thicknesses of the transistors (e.g., $V_{GS}$<4 V and $V_{DS}$<4 V). The transistors in the sampling circuit or the conversion circuit may have different sizes or breakdown voltage levels that vary with manufacturing technology. Transistors having higher breakdown voltages may be fabricated using a thicker oxide layer that increases the minimum allowable size of the transistor. Therefore, a reduction in the number of transistors that interact with higher voltage signals results in a smaller circuit size, increased circuit speed, and lower power consumption of the successive-approximation ADC.

Figure 1:
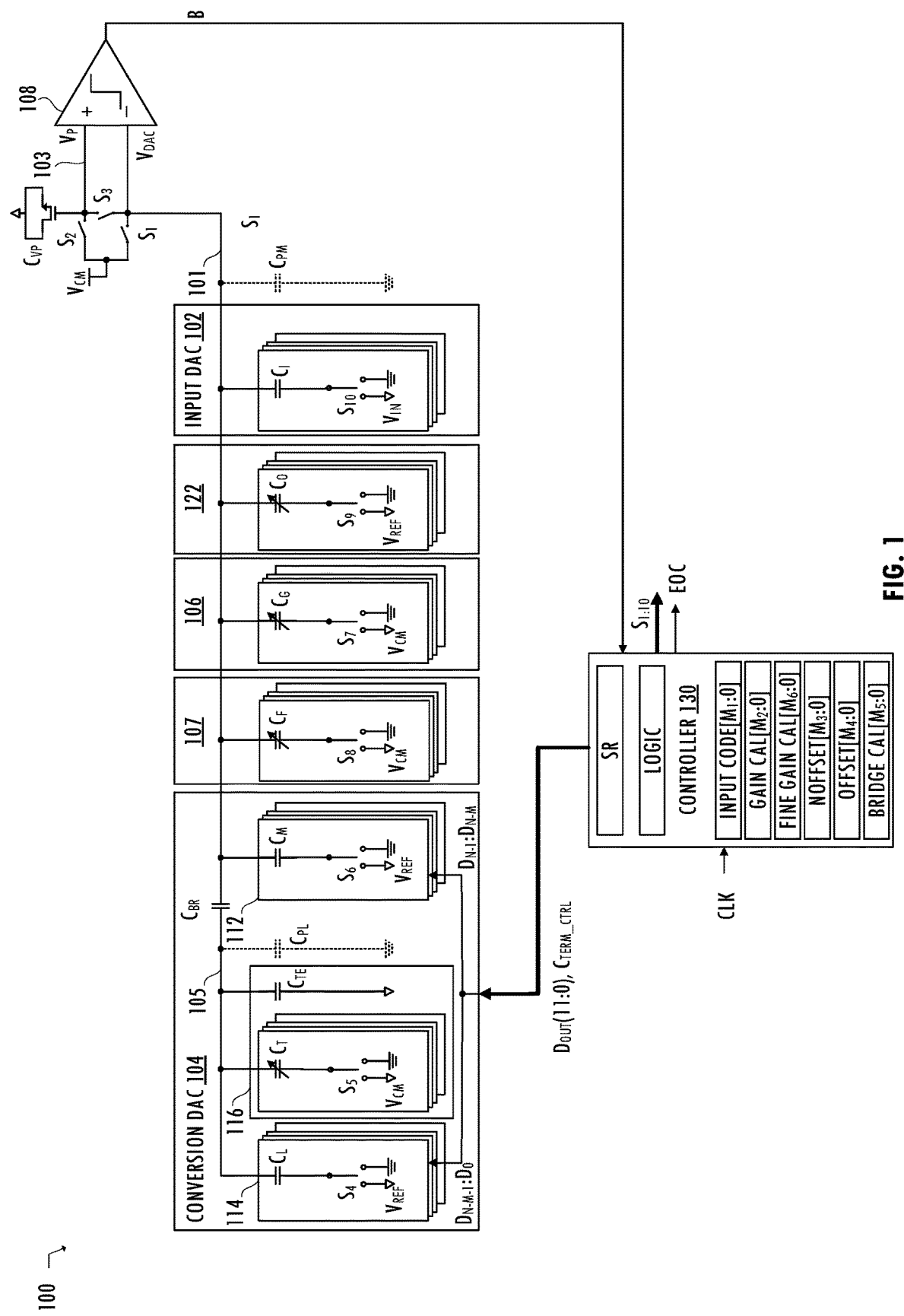
FIG. 1 illustrates a functional block diagram of a successive-approximation ADC including a gain tuning DAC and a fine gain tuning DAC in a programmable gain tuning circuit consistent with at least one embodiment of the invention.
Figure 5:
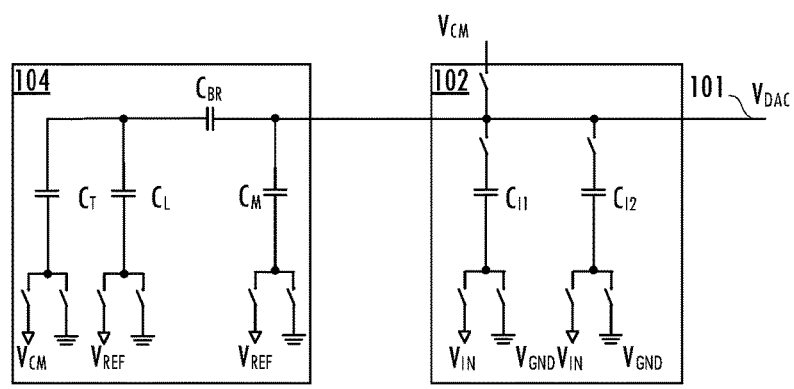
FIG. 5 illustrates a functional block diagram of a simplified version of the successive-approximation ADC of FIG. 1 including multiple input DACs, each providing a programmable input capacitance for a different input source selectively enabled by the successive-approximation ADC for a conversion consistent with at least one embodiment of the invention.

Referring to FIG. 1, successive-approximation ADC 100 includes input DAC 102 that samples input analog signal $V_{IN}$ separately from conversion DAC 104 (e.g., a charge-redistribution DAC or a voltage-scaling DAC), gain tuning DAC 106, and offset DAC 122. In at least one embodiment, input DAC 102 is a capacitive DAC that provides input capacitance $C_I$ for a programmable voltage division that is determined by an input code applied to switches $S_{10}$. Each branch of input DAC 102 includes one or more capacitors that are selectively enabled by a corresponding bit of a digital code, e.g., a predetermined input code having $M_1$ bits, where $M_1$ is an integer greater than zero, stored in register INPUT CODE [$M_1$:0]. The total number of capacitors in input DAC 102 is fixed (e.g., 68). Depending on the contents of register INPUT CODE [$M_1$:0], the branches are either enabled and the bottom plate of the corresponding capacitor is coupled to input analog signal $V_{IN}$ during a sampling phase of an analog-to-digital conversion, or are disabled and the bottom plate of the corresponding capacitor is coupled to ground during all phases of digital-to-analog conversion. A floating state between input analog signal $V_{IN}$ and ground is used when a branch switches from being coupled to input analog signal $V_{IN}$ during a sampling phase, to being coupled to ground during following phases. The floating state prevents a short between input analog signal $V_{IN}$ and ground (i.e., implements break-before-make). The branch can also be floated when input DAC 102 is unused (e.g., the top plate of the corresponding capacitor is coupled to an open switch), the bottom plate of the corresponding capacitor floats to reduce the effects of parasitic capacitance on other input DACs (as discussed further below with reference to FIG. 5).

Referring to FIG. 1, switches $S_{10}$ are illustrated as three-way switches that couple a plate of a corresponding capacitor to input analog signal $V_{IN}$ when enabled, couple the plate of the corresponding capacitor to a ground node when disabled or an enabled switch finishes sampling, or float the node coupled to the plate of the corresponding capacitor when a branch is opening a switch and before closing another switch. Each of switches $S_{10}$ includes at least one high voltage transistor. The division ratio is $C_{Iin}/C_I$, where $C_I$ is the summation of capacitance of the enabled input branches and $C_I$ is the summation of capacitance of all input branches. For example, one branch having 34 unit capacitance is enabled and the total input capacitance is 68, then the division ratio is 34/68=1/2 and the input voltage is divided by two. If the input voltage is 5 V, then input DAC 102 divides the input voltage by two and reference voltage $V_{REF}$ can be a 2.5 V for the analog-to-digital conversion. To reduce the number of high-voltage transistors included in successive-approximation ADC 100, input capacitance $C_I$ is separate from conversion DAC 104. In an exemplary embodiment of successive-approximation ADC 100, high voltage transistors operate in a 5.5 V voltage domain and the common mode voltage is maintained below 2.4 V so that switches coupled to the top plate of capacitors in input DAC 102 can be low-voltage transistors (e.g., switches $S_1$, $S_2$, and $S_3$ are low-voltage transistors in a 2.4 V voltage domain).

In an exemplary embodiment, input DAC 102 divides input analog signal $V_{IN}$ by a predetermined ratio between 1/68 to 68/68 by coupling some input capacitors to the input analog signal and all of the other input capacitors to the ground node during the sampling phase of an analog-to-digital conversion. The predetermined ratio can be used to convert an input signal having a large input analog signal range to a digital code using a smaller reference signal. The total capacitance of the capacitive units in input DAC 102 is greater than the total capacitance of the capacitive units in conversion DAC 104 to compensate for capacitive mismatch and to configure the compensation in one direction only (i.e., the compensation always reduces the sampling range to match the conversion range). The input division occurs when charge distribution occurs, i.e., during a charge-sharing phase of the analog-to-digital conversion.

For simplicity, starting by assuming that input capacitance $C_I$ equals conversion capacitance $C_C$, and all of gain tuning capacitance 106, fine gain tuning capacitance 107, offset capacitance 122, bridge capacitance 116, and parasitic capacitances $C_{PL}$ and $C_{PM}$ are ignored, conversion capacitance $C_C$ represents the combination of conversion capacitance $C_M$, bridge capacitance $C_{BR}$, and conversion capacitance $C_L$:

$$C_C = C_M + \frac{C_{BR} \times C_L}{C_{BR} + C_L},$$

where the signal on node 101 is analog signal $V_{DAC}$. In a sampling phase of an analog-to-digital conversion, controller 130 closes switches $S_1$, $S_2$, and $S_3$, thereby coupling node 101 to analog signal $V_{CM}$ and switches $S_4$ and $S_6$ are coupled to ground (except during offset cancellation, discussed further below). Controller 130 also closes switch $S_{10}$ coupling input capacitance $C_I$ to input signal $V_{IN}$ and input capacitance $C_I$ stores charge as a result of the voltage difference $V_{CM}-V_{IN}$ between its terminals. Controller 130 opens switches $S_1$, $S_2$, and $S_3$ at the end of the sampling phase. Next, controller 130 floats input capacitance $C_I$ by disconnecting input capacitance $C_I$ from input signal $V_{IN}$ and connects all capacitors of input capacitance $C_I$ to ground using switch $S_{10}$, and the charge distribution occurs. Accordingly, sampling the input analog signal and distribution of the charge causes analog signal $V_{DAC}$ to be:

$$V_{DAC}=V_{CM} \text{ (during sampling)};$$

$$V_{DAC} = V_{CM} - V_{IN} \times \frac{C_I}{C_I + C_C}$$

(after charge distribution of the charge-sharing phase).

In a conversion phase of an analog-to-digital conversion, controller 130 flips switches $S_4$ and $S_6$ between reference voltage $V_{REF}$ and ground and during the conversion phase voltage $V_{DAC}$ becomes:

$$V_{DAC} = V_{CM} - V_{IN} \times \frac{C_I}{C_I + C_C} + V_{REF} \times \frac{C_{C_{REF}}}{C_I + C_C} = V_{CM} + \frac{C_{C_{REF}} \times V_{REF} - C_I \times V_{IN}}{C_I + C_C},$$

where conversion capacitance branches $C_{C_{REF}}$ are the sum of the effective capacitances of those branches of conversion capacitance $C_C$ that are coupled to reference voltage $V_{REF}$ by switches $S_4$ or $S_6$. Successive-approximation, described below, will switch conversion capacitance $C_{C_{REF}}$ from 0 to $C_C$ in binary steps (e.g., using a binary search) to determine a value of digital code $D_{OUT}(N-1:0)$ that corresponds to the minimum conversion capacitance $C_{C_{REF}}$ that makes the following relationships true:

$$C_{C_{REF}} \times V_{REF} \approx C_I \times V_{IN};$$

$$V_N \approx \frac{C_{C_{REF}}}{C} \times V_{REF}, \text{ where } C_{C_{REF}} \in \{0 - C_C\}.$$

If input capacitance $C_I$ equals conversion capacitance $C_C$, then different settings can be generated by enabling switches $S_{10}$ to selectively couple capacitive branches of input capacitance $C_I$ to input analog signal $V_{IN}$ during sampling. In at least one embodiment, unused capacitive branches of input capacitance $C_I$ are coupled to ground during sampling and conversion by corresponding switches $S_{10}$. As a result, in the conversion phase:

$$V_{DAC} = V_{CM} + \frac{C_{C_{REF}} \times V_{REF} - C_{Iin} \times V_{IN}}{C_I + C_C},$$

and $$V_{IN} \approx \frac{C_{C_{REF}}}{C_{Iin}} \times V_{REF}, \text{ where } C_{C_{REF}} \in \{0 - C_C\} \text{ and}$$

$$C_{Iin} \in \{0 - C_I\}.$$

where $C_{Iin}$ are branches of input capacitance $C_I$ that are coupled to the input analog signal $V_{IN}$ during sampling. Note that the denominator is fixed, regardless of the input code setting. In at least one embodiment of successive-approximation ADC 100, the ratio of conversion capacitance $C_C$ to enabled branches of input capacitance $C_I$ is selectable to allow for different ranges of input analog signals. For example, for $C_Iin=1\times C_C$, $C_{Iin}=\frac{1}{2}\times C_C$, or $C_{Iin}=\frac{1}{4}\times C_C$, successive-approximation ADC 100 converts input analog signal $V_{IN}$ to a signal in the range of 0 to $1\times V_{REF}$, 0 to $2\times V_{REF}$, or 0 to $4\times V_{REF}$, respectively.

As discussed above, a target for input capacitance $C_I$ is to always be larger than conversion capacitance $C_C$ so that a gain compensation circuit always compensates in one direction (e.g., the gain compensation circuit always lowers the sampling range to match the conversion range). In at least one embodiment, input capacitance $C_I$ has 68 capacitive units and conversion capacitance $C_C$ has an equivalent capacitance of 64 capacitive units implemented using 63 capacitive units that are controlled by 6 most-significant bits of $D_{OUT}[N-1:0]$ (e.g., $D_{OUT}[11:6]$), a bridge capacitance, and 64 capacitive units controlled by 6 least-significant bits of $D_{OUT}[N-1:0]$ (e.g., $D_{OUT}[5:0]$). The variation of the total capacitance of conversion capacitance $C_C$ due to mismatch is:

$$3 \times \frac{\sigma \Delta CU}{CU} \times 64 \ CU = 3 \times 0.15\% \times 64 \ CU < 1 \ CU.$$

The variation of the total capacitance of input capacitance $C_I$ due to mismatch is:

$$3 \times \frac{\sigma \Delta CU}{CU} \times 68 \ CU = 3 \times 0.15\% \times 68 \ CU < 1 \ CU.$$

The total capacitance of conversion capacitance $C_C$ is always smaller than 65 CU, while the total capacitance of input capacitance $C_I$ is always larger than 67 CU. Therefore, input capacitance $C_I$, which includes an additional 4 CU, will always have a higher total capacitance, as compared to conversion capacitance $C_C$.

Figure 2:
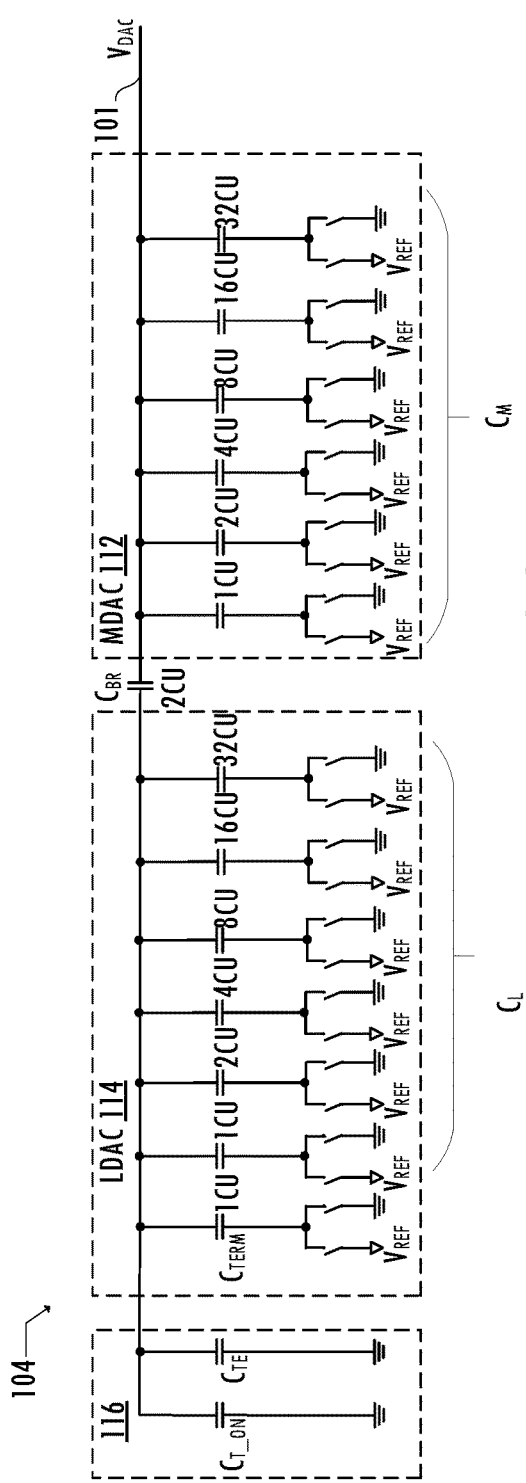
FIG. 2 illustrates a functional block diagram of an exemplary conversion DAC of the successive-approximation ADC of FIG. 1 consistent with at least one embodiment of the invention.

Referring to FIG. 2, conversion capacitance $C_C$ of conversion DAC 104 is implemented separately from the input capacitance $C_I$ of input DAC 102 to reduce the number of high voltage transistors (e.g., CMOS transistors that have a breakdown voltage that is just over reference voltage $V_{D1}$) used by the successive-approximation ADC. In an exemplary embodiment, a large capacitive binary DAC is divided into MDAC 112 that provides conversion capacitance $C_M$ according to the most-significant bits of the digital code INPUT CODE and LDAC 114 that provides conversion capacitance $C_L$ according to the least-significant bits of the digital code INPUT CODE. For area efficiency, both DACs have the same order (e.g., an order of 6, which includes $2^6=64$ unit capacitances each including the terminal capacitor). MDAC 112 replaces its terminal capacitor with LDAC 114. Therefore, MDAC 112 includes 63 unit capacitances. LDAC 114 is coupled to a series capacitance (i.e., a bridge capacitor or attenuating capacitor, e.g., bridge capacitor $C_{BR}$) that reduces the total amount of capacitance required for the N-bit DAC as compared to an N-bit DAC using the same unit capacitance CU and without using a bridge capacitor. Ignoring bridge tuning DAC 116, conversion DAC 104 provides a conversion capacitance $C_C$:

$$C_C = C_M + \frac{C_{BR} \times (C_L)}{C_{BR} + (C_L)},$$

where conversion capacitance $C_M$ corresponds to the total capacitance of MDAC 112, conversion capacitance $C_L$ corresponds to the total capacitance of LDAC 114, and $C_{BR}$ is the bridge capacitance. For a value of digital code $D_{OUT}$, the conversion capacitance $C_{C_{REF}}$ is the capacitance realized by only those branches of the conversion capacitance $C_C$ coupled to reference voltage $V_{REF}$, (i.e., the capacitance realized by the enabled branches according to a value of digital code $D_{OUT}$). The remaining switches of the conversion capacitance are coupled to the ground node.

In an embodiment of the conversion DAC 104, bridge capacitor $C_{BR}$ acts as a 64:1 divider that scales the lower six bits by a factor of $\frac{1}{64}$ (64 is the order of LDAC 114, i.e., the number of unit capacitance CU in conversion capacitance $C_L$). The equivalent reference voltage scaling of the total capacitance of LDAC 114 on voltage $V_{DAC}$ is designed to be equivalent to the voltage scaling of a least-significant bit of MDAC 112 (or equivalently, its removed terminal capacitor), e.g., 1 CU. Ignoring bridge tuning DAC 116 and any parasitic capacitance, the value of bridge capacitor $C_{BR}$ should be:

$$V_{DAC} = V_{REF} \times \frac{C_L}{C_L + \frac{C_{BR} \times C_M}{C_{BR} + C_M}} \times \frac{C_{BR}}{C_{BR} + C_M} = V_{REF} \times \frac{1 \ CU}{C_M + \frac{C_{BR} \times C_L}{C_{BR} + C_L}};$$

therefore, $$C_{BR} = \frac{C_L}{C_L - CU} \ CU = \frac{64}{63} \ CU.$$

Thus, bridge capacitor $C_{BR}$ and LDAC 114 replace a terminal capacitor for MDAC 112. For an N-bit embodiment of conversion DAC 104, an embodiment of MDAC 112 has 63 unit capacitances and LDAC 114 has 64 unit capacitances. When a branch of LDAC 114 is selectively coupled to reference voltage $V_{REF}$, analog signal $V_{DAC}$ on node 101 increases as if the switching branch is divided by the order of MDAC 112 in addition to being divided by the total capacitance of LDAC 114:

$$V_{DAC} = V_{REF} \times \frac{C_{L_{REF}}}{C_L + \frac{C_{BR} \times C_M}{C_{BR} + C_M}} \times \frac{C_{BR}}{C_{BR} + C_M},$$

thus $$\frac{V_{DAC}}{V_{REF}} = \frac{C_{L\_REF}}{C_L \times \left(\frac{C_M + CU}{CU}\right)} \left(\text{when } C_{BR} = \frac{C_L}{C_L - CU} CU\right),$$

where $C_{L_{REF}}$ is the summation of the capacitance of the branches of LDAC 114 coupled to $V_{REF}$. In at least one embodiment, if $$C_M = 63 \ CU, \text{ then } \frac{C_M + CU}{CU} = 64$$

and $$\frac{V_{DAC}}{V_{REF}} = \frac{C_{L\_REF}}{C_L \times 64}.$$

In at least one embodiment, a 12-bit conversion DAC uses 64+63+64/63 (128.016) unit capacitances instead of $2^{12}$ (4096) unit capacitances for a binary capacitive DAC architecture. Thus, for the same area, the unit capacitance can be larger and more practical as compared to a binary capacitive DAC architecture. Any parasitic capacitance on node 101 will attenuate both voltage scaling of branches of MDAC 112 and LDAC 114, but will not affect bridge capacitor $C_{BR}$, as shown:

$$\frac{V_{DAC}}{V_{REF}} = \frac{C_L}{C_L + \frac{C_{BR} \times (C_M + C_{PM})}{C_{BR} + C_M + C_{PM}}} \times \frac{C_{BR}}{C_{BR} + C_M + C_{PM}} =$$

$$\frac{1 \ CU}{C_M + C_{PM} + \frac{C_{BR} \times C_L}{C_{BR} + C_L}};$$

therefore $$C_{BR} = \frac{C_L}{C_L - CU} CU = \frac{64}{63} CU.$$

Referring to FIG. 1, parasitic capacitance $C_{PL}$ on node 105 will be seen by both LDAC 114 and MDAC 112 of conversion capacitance $C_C$.

$$V_{DAC} = V_{REF} \times \frac{C_L}{C_L + C_{PL} + \frac{C_{BR} \times C_M}{C_{BR} + C_M}} \times \frac{C_{BR}}{C_{BR} + C_M} =$$

$$V_{REF} \times \frac{1 CU}{C_M + \frac{C_{BR} \times (C_L + C_{PL})}{C_{BR} + C_L + C_{PL}}},$$

therefore, $$C_{BR} = \frac{C_L + C_{PL}}{C_L - CU} CU.$$

Thus, the required bridge capacitor $C_{BR}$ is increased to compensate for the increase in total capacitance on node 105 by the parasitic capacitance. Any parasitic capacitance on node 101 will attenuate both voltage scaling of branches of MDAC 112 and LDAC 114, and still does not affect the value of bridge capacitor $C_{BR}$, as shown:

$$V_{DAC} = V_{REF} \times \frac{C_L}{C_L + C_{PL} + \frac{C_{BR} \times (C_M + C_{PM})}{C_{BR} + C_M + C_{PM}}} \times \frac{C_{BR}}{C_{BR} + C_M + C_{PM}} =$$

$$V_{REF} \times \frac{1 CU}{C_M ++ C_{PM} + \frac{C_{BR} \times (C_L + C_{PL})}{C_{BR} + C_L + C_{PL}}};$$

therefore $$C_{BR} = \frac{C_L + C_{PL}}{C_L - CU} CU.$$

The capacitance of bridge capacitor $C_{BR}$ is not usually an integer multiple of CU and parasitic capacitance $C_{PL}$ on node 105 is difficult to predict and both can vary due to manufacturing mismatches. In at least one embodiment, successive-approximation ADC 100 includes bridge tuning DAC 116 that compensates for parasitic capacitance $C_{PL}$ and mismatches in the capacitance of bridge capacitor $C_{BR}$ and capacitance $C_L$ of LDAC 114. Bridge capacitance $C_{BR}$ is intentionally higher than required (i.e., higher than the capacitance required for maximum expected parasitic capacitance and capacitance variation compensation). Bridge tuning DAC 116 looks like a parasitic capacitance in parallel to LDAC 114. Bridge tuning DAC 116 is coupled in parallel with parasitic capacitance $C_P$ to provide a programmable capacitance that causes LDAC 114 and the larger bridge capacitance $C_{BR}$ to provide the target voltage scaling of analog signal $V_{DAC}$ on node 101. In at least one embodiment, a digital code for programming bridge tuning capacitance $C_T$ provided by bridge tuning DAC 116 is determined by the integrated circuit as discussed further below. Enabled capacitive branches of bridge tuning DAC 116 are coupled to ground. Unused capacitive branches of bridge tuning DAC 116 are floating. The bottom plate of the capacitive branch that is coupled to switch $S_5$ will move with the node 105 when the switch $S_5$ is open (i.e., the capacitive branch is floating). The voltage difference between both plates is fixed (i.e., the charge stored on the capacitor multiplied by its capacitance value). During sampling, the capacitors are charged with the common mode voltage on node 101. If the voltage on the top plate is low enough (e.g., during conversion) and due to the precharge, then the voltage on the bottom plate can go below the ground voltage (e.g., negative, which can cause latch-up or leakage) or above supply level (which can cause breakdown or leakage). Instead, the bottom plate is coupled to the common mode voltage during sampling to avoid the voltage on the bottom plate from exceeding the supply level or falling below ground when it is floated and following the voltage swing of the top plate.

Mismatch between input capacitance $C_I$ and conversion capacitance $C_C$ causes a gain error in the analog-to-digital conversion performed by successive-approximation ADC 100. In at least one embodiment of successive-approximation ADC 100, input capacitance $C_I$ is intentionally greater than conversion capacitance $C_C$ and gain tuning DAC 106 and fine gain tuning DAC 107 are configured to provide gain tuning capacitances $C_G$ and $C_F$, respectively, to adjust the effective gain by discharging enough charge to equate the range of input DAC 102 to the range of conversion DAC 104. In at least one embodiment of gain tuning DAC 106, when a capacitive branch is disabled in gain tuning capacitances $C_G$ and $C_F$, their respective switches $S_7$ or switch $S_8$, couple the bottom plate of the capacitor to analog signal $V_{CM}$ during sampling (thus, the capacitor has the same voltage at both terminals and will not get discharged), and is floated before sampling ends (e.g., before opening switches $S_1$, $S_2$, and $S_3$). Since both plates of the disabled capacitive branches are coupled to the common mode voltage during sampling, the capacitors will not load the common mode buffer. In at least one embodiment of gain tuning DAC 106, gain tuning capacitance $C_F$ is always coupled to ground when enabled and behaves similar to parasitic capacitance $C_{PM}$. When a capacitive branch of gain tuning capacitance $C_G$ is enabled, the bottom plate is coupled to ground during the sampling phase and the charge-sharing phase but is floated during the conversion phase. During a conversion phase of the analog-to-digital conversion, switch $S_7$ floats gain tuning capacitance $C_G$ and gain tuning capacitance $C_G$ does not affect the range of conversion DAC 104.

By coupling gain tuning capacitances $C_G$ and $C_F$ to node 101 in parallel with input capacitance $C_I$ instead of directly tuning input capacitance $C_I$, switches $S_7$ and $S_8$ of gain tuning DAC 106 need not be high-voltage switches (e.g., CMOS switches that have a breakdown voltage that is just over reference voltage $V_{D1}$) and low-voltage switches (e.g., CMOS switches that have a breakdown voltage that is just over reference voltage $V_{D2}$) are used instead. A predetermined digital code stored in register GAIN CAL[$M_2$:0], where $M_2$ is an integer greater than zero, is used to configure gain tuning capacitance $C_G$, while a predetermined digital code stored in register FINE GAIN CAL[$M_6$:0], where $M_6$ is an integer greater than zero, is used to configure fine gain tuning capacitance $C_F$. Both gain tuning capacitances $C_G$ and $C_F$ are configured to discharge enough charge during a charge-sharing phase between the sampling phase and the conversion phase of analog-to-digital conversion to equate the range of input DAC 102 to the range of conversion DAC 104 for an input division setting. Each input division setting can use a corresponding predetermined digital code for optimum configuration of gain tuning capacitances $C_G$ and $C_F$. Determination of the predetermined digital code for configuring gain tuning capacitances $C_G$ and $C_F$ for each input division setting can be automated, as discussed below. Gain tuning DAC 106 adjusts the ratio of the divided voltage range of input DAC 102 to the range of conversion DAC 104 to convert any input analog signal range using any reference signal level. The technique can also compensate for reference voltage $V_{REF}$ being greater than input analog signal $V_{IN}$ but if the difference is large, then attenuation of reference voltage $V_{REF}$ may be more practical. Therefore, a maximum input analog signal level can correspond to a maximum digital code $D_{OUT}$ regardless of the actual ratio of the maximum input analog signal to the reference signal. Thus, successive-approximation ADC 100 uses the entire conversion range and has improved resolution (e.g., signal-to-noise ratio) than other embodiments of a successive-approximation ADC.

In at least one embodiment, gain tuning capacitance $C_G$ implements gain tuning. Although illustrated as being coupled to node 101, in other embodiments, gain tuning capacitance $C_G$ may be coupled to the other plate of bridge capacitance $C_{BR}$ to use the bridge capacitor to implement finer steps, e.g., as gain tuning capacitance $C_{G2}$ in FIG. 4B. To compensate for a mismatch between input capacitance $C_I$ and conversion capacitance $C_C$, switches $S_7$ couple gain tuning capacitance $C_G$ to ground during the sampling phase of the analog-to-digital conversion and is floated during the conversion phase of the analog-to-digital conversion. The analog-to-digital conversion includes an intermediate phase between the sampling phase and the conversion phase of the analog-to-digital conversion. In this intermediate phase, switches $S_1$, $S_2$, and $S_3$ decouple analog signal $V_{CM}$ from node 101 and then switches $S_{10}$ decouple the input capacitance from the input signal $V_{IN}$ and couple the input capacitance to ground. Switches $S_7$ keep enabled gain tuning capacitance $C_G$ coupled to ground during this phase. Thus, in the sampling phase, node 101 is coupled to analog signal $V_{CM}$, i.e.:

$$V_{DAC} = V_{CM}.$$

Next, when entering the intermediate sharing phase, $V_{DAC}$ becomes:

$$V_{DAC} = V_{CM} - V_{IN} \times \frac{C_I}{C_I + C_C + C_G}.$$

In the conversion phase:

$$V_{DAC} = V_{CM} - V_{IN} \times \frac{C_I}{C_I + C_C + C_G} + V_{REF} \times \frac{C_{C_{REF}}}{C_I + C_C};$$

$$V_{DAC} = V_{CM} + \frac{C_{C_{REF}} \times V_{REF} - \frac{C_I + C_C}{C_I + C_C + C_G} \times C_I \times V_{IN}}{C_I + C_C}.$$

Input capacitance $C_I$ is made larger than conversion capacitance $C_C$, by an amount that is at least greater than any expected mismatch between the two capacitances. Gain tuning capacitance $C_G$ is sized to have a total capacitance that can compensate for an extreme mismatch between the two capacitances. The highest gain tuning capacitance $C_G$ should be able to compensate for a mismatch that increases the capacitance of input capacitance $C_I$ to the maximum expected capacitance and conversion capacitance $C_C$ to the lowest expected capacitance with gain tuning capacitance $C_G$ itself having the lowest value expected from mismatch. Gain tuning capacitance $C_G$ step size (in unit capacitance CU) should be small enough to limit any remaining error to a target specification (e.g., +/−1 LSB). If gain tuning capacitance $C_G$ is also used to compensate for input and reference range offsets and mismatches, then the capacitance values should also account for those offsets and mismatches. A design target is to make sampling and conversion ranges equal, therefore:

$$\frac{C_{Iin} V_{IN}}{C_I + C_C + C_G + C_P} = \frac{C_C \times V_{REF}}{C_I + C_C + C_P},$$

which may be represented as $$C_G = \frac{C_I + C_C + C_P}{C_C} \times (C_{Iin} - C_C) \times \frac{\mathrm{MAX}(V_{IN})}{V_{REF}}.$$

For simplicity, parasitic capacitance $C_P$ includes effects of parasitic capacitances at node 105 (i.e., $C_{PL}$) and node 101 (i.e., $C_{PM}$), extra bridge capacitance and bridge tuning capacitances $C_{Ton}$, and fine gain tuning capacitance $C_F$:

$$C_P = C_{PM} + C_F + \left( \frac{C_{BR} \times (C_{Ton} + C_L + C_{PL})}{C_{BR} + (C_{Ton} + C_L + C_{PL})} - C_U \right),$$

where $C_U$ is the unit capacitance of MDAC 112. Therefore, the lowest range of gain tuning capacitance $C_G$ that tunes any error can be calculated using a maximum value of input capacitance $C_I$, a minimum value of conversion capacitance $C_C$, a maximum value of input analog signal $V_{IN}$, a minimum value of reference voltage $V_{REF}$ (including offset), and a maximum expected value of parasitic capacitance $C_P$.

Figure 3:
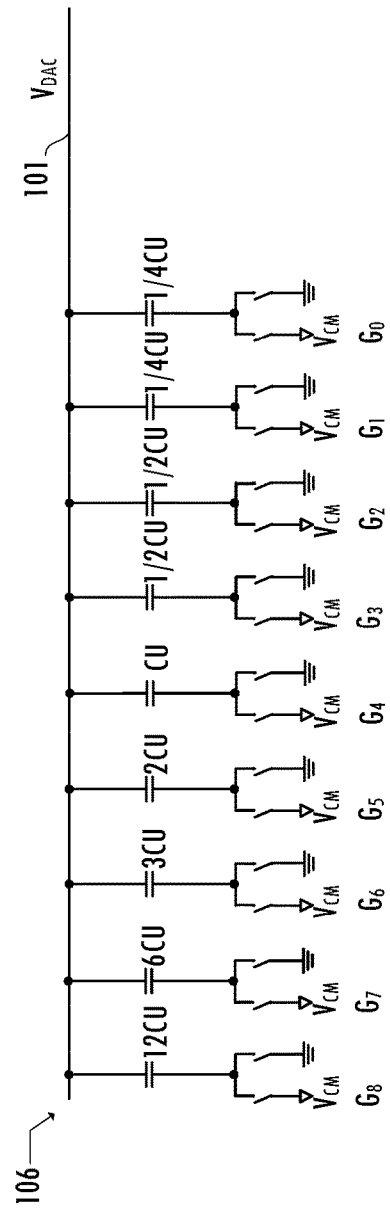
FIG. 3 illustrates a functional block diagram of an exemplary gain tuning DAC of the successive-approximation ADC of FIG. 1 consistent with at least one embodiment of the invention.

FIG. 3 illustrates an exemplary embodiment of gain tuning DAC 106. A target tuning step is equivalent to at least ¼ least significant bit of MDAC. This requires realization of a relatively small gain tuning capacitance $C_G$ unit capacitance. Referring to the following representation of gain tuning capacitance $C_G$:

$$C_G = \frac{C_I + C_C + C_P}{C_C}(C_I - C_C) \times \frac{\max(V_{IN})}{V_{REF}} =$$
$$\left( \frac{C_I + C_C}{C_C}(C_I - C_C) + \frac{(C_I - C_C)}{C_C} C_P \right) \times \frac{\max(V_{IN})}{V_{REF}},$$

As an alternative, to obtain a target fine tuning step, increasing parasitic capacitance $C_P$ increases effective gain tuning capacitance $C_G$ by $$\frac{(C_I - C_C)}{C_C} \times \frac{\max(V_{IN})}{V_{REF}}.$$

This can be used to provide finer steps and realizes a smaller gain tuning resolution in a more practical way. The idea is to calibrate the gain tuning capacitance $C_G$ so that the conversion range becomes larger than the sampling range with the smallest error possible for the gain capacitor tuning step size. Then, the value of fine gain tuning capacitance $C_F$ is increased to reduce the conversion range to match the sampling range as closely as possible. From the equation above, each fine gain tuning step is attenuated by $$\frac{(C_I - C_C)}{C_C},$$

which in the exemplary embodiment is approximately 1/16. Therefore, for the same branch capacitance value, the fine gain tuning capacitance $C_F$ has a resolution that is smaller by 1/16 as compared to gain tuning capacitance $C_G$.

Figure 4A:
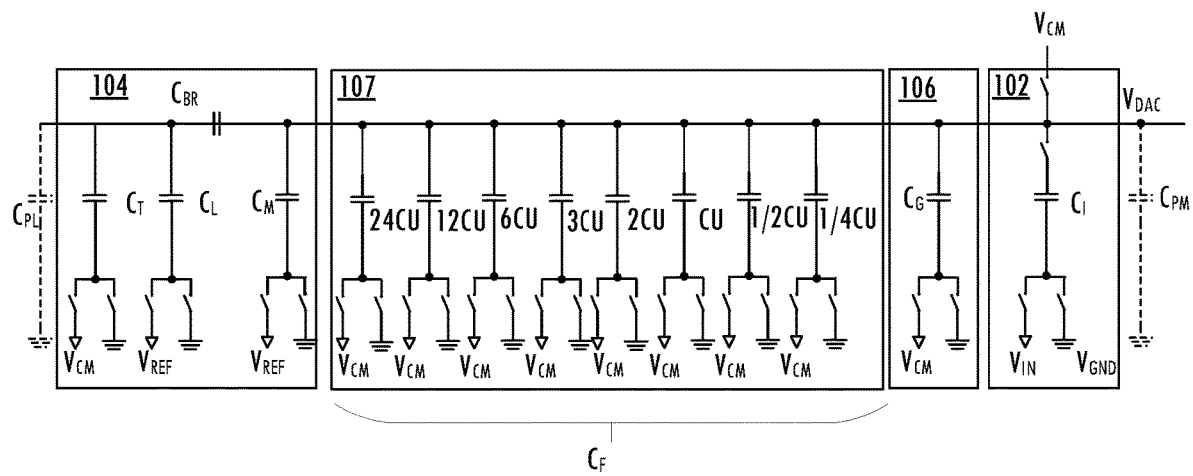
FIG. 4A illustrates a functional block diagram of a simplified version of the successive-approximation ADC of FIG. 1 including an exemplary fine gain tuning DAC consistent with at least one embodiment of the invention.

Referring to FIGS. 1 and 4A, a technique for increasing parasitic capacitance $C_P$ couples fine gain tuning capacitance $C_F$ in parallel with parasitic capacitance $C_{PM}$. When enabled, branches of gain tuning capacitance $C_F$ will affect node 101 during all phases (i.e., sampling, charge-sharing, and conversion phases) of the analog-to-digital conversion and will be coupled to ground by switch $S_8$. Those enabled branches attenuate the range of the analog-to-digital conversion, thus slightly degrading the range of the signal-to-noise ratio. Therefore, in some embodiments, the minimum step of gain tuning capacitance $C_G$ is reduced to a lowest practical value to reduce the required value of gain tuning capacitance $C_F$. Referring to FIGS. 3 and 4A, in at least one embodiment, both gain tuning DAC 106 and fine gain tuning DAC 107 have a radix that is less than two (i.e., the step size between branches is not always a divide by two and some overlap exists). This overlap is included intentionally to relax mismatch requirements of the capacitive branches so that some dummy capacitors can be used to construct the tuning DAC. The overlap also allows switches $S_7$ and $S_8$ to be designed without scaling that matches the capacitive branch, thereby reducing area and reducing leakage error when capacitive branches are floated.

Figure 4B:
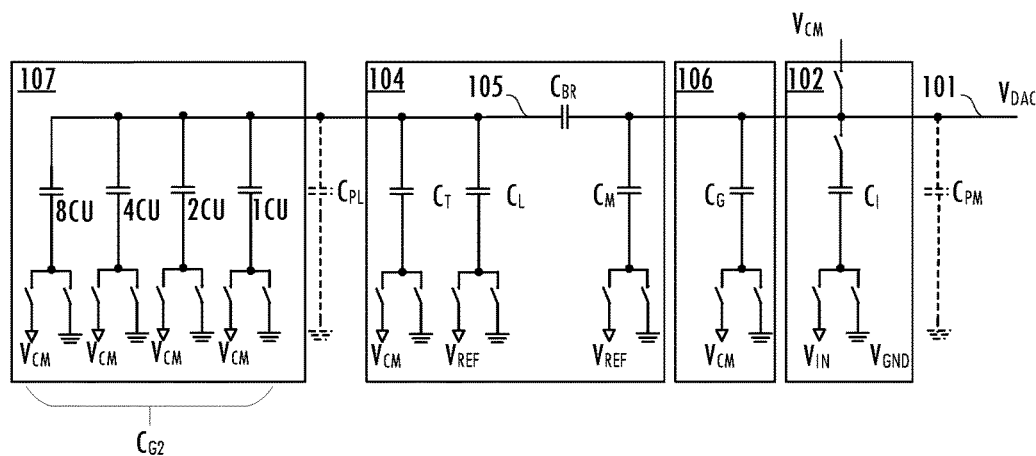
FIG. 4B illustrates a functional block diagram of a simplified version of the successive-approximation ADC of FIG. 1 including an alternative fine gain tuning DAC consistent with at least one embodiment of the invention.

Referring to FIG. 4B, in at least one embodiment, gain tuning DAC 106 is coupled to another embodiment of fine gain tuning DAC 107 via bridge capacitance $C_{BR}$. In this embodiment, the fine gain tuning capacitance $C_{G2}$ operates similarly to gain tuning capacitance $C_G$. Since bridge capacitor $C_{BR}$ separates fine gain tuning capacitance $C_{G2}$ from node 101, the attenuation of bridge capacitance $C_{BR}$ causes finer steps of fine gain tuning capacitance $C_{G2}$. When fine gain tuning capacitance $C_{G2}$ is disabled, the equivalent capacitance of bridge capacitor $C_{BR}$ and the branches coupled to it as seen from node 101 is:

$$\frac{C_{BR} \times (C_L + C_T + C_{PL})}{C_{BR} + C_L + C_T + C_{PL}}.$$

When fine gain tuning capacitance $C_{G2}$ is enabled, the equivalent capacitance is:

$$\frac{C_{BR} \times (C_L + C_T + C_{PL} + C_{G2})}{C_{BR} + C_L + C_T + C_{PL} + C_{G2}}.$$

The difference is the effective gain capacitance tuning. In at least one embodiment, a digital code for programming gain tuning capacitance $C_G$ provided by gain tuning DAC 106 and a digital code for programming fine gain tuning capacitance $C_F$ provided by fine gain tuning DAC 107 are determined by the integrated circuit as discussed further below.

In at least one embodiment, successive-approximation ADC 100 includes multiple input DACs coupled together. Input DAC 102 of FIG. 5 includes two input capacitances $C_{I1}$ and $C_{I2}$ each coupled to different input sources and controlled by separate switches and control signals. A switch on the top plate of each branch of input DAC 102 is included to enable the conversion for the selected DAC and isolate the corresponding input capacitance from the other DACs. Switches $S_{10}$ in input DAC 102 and any other switch in the signal path from the input source to input DAC 102 include high-voltage transistors (e.g., CMOS switches that have a breakdown voltage that is just over reference voltage $V_{D1}$), which are leaky. When multiple input sources are coupled to the same input capacitance, the leakage accumulates. Therefore, additional input capacitances may be used to reduce the leakage error by reducing the number of inputs per input DAC (i.e., reduce the number of leakage paths) Such embodiments include a separate gain calibration code [$M_2$:0] for each of input capacitances $C_{I1}$ and $C_{I2}$ and also may include separate offset codes [$M_3$:0] and [$M_4$:0]. In other embodiments, the multiple sampling capacitances are used for multiplexing or to speed up conversion (e.g., start sampling using one capacitance while converting using another capacitance).

Figure 6:
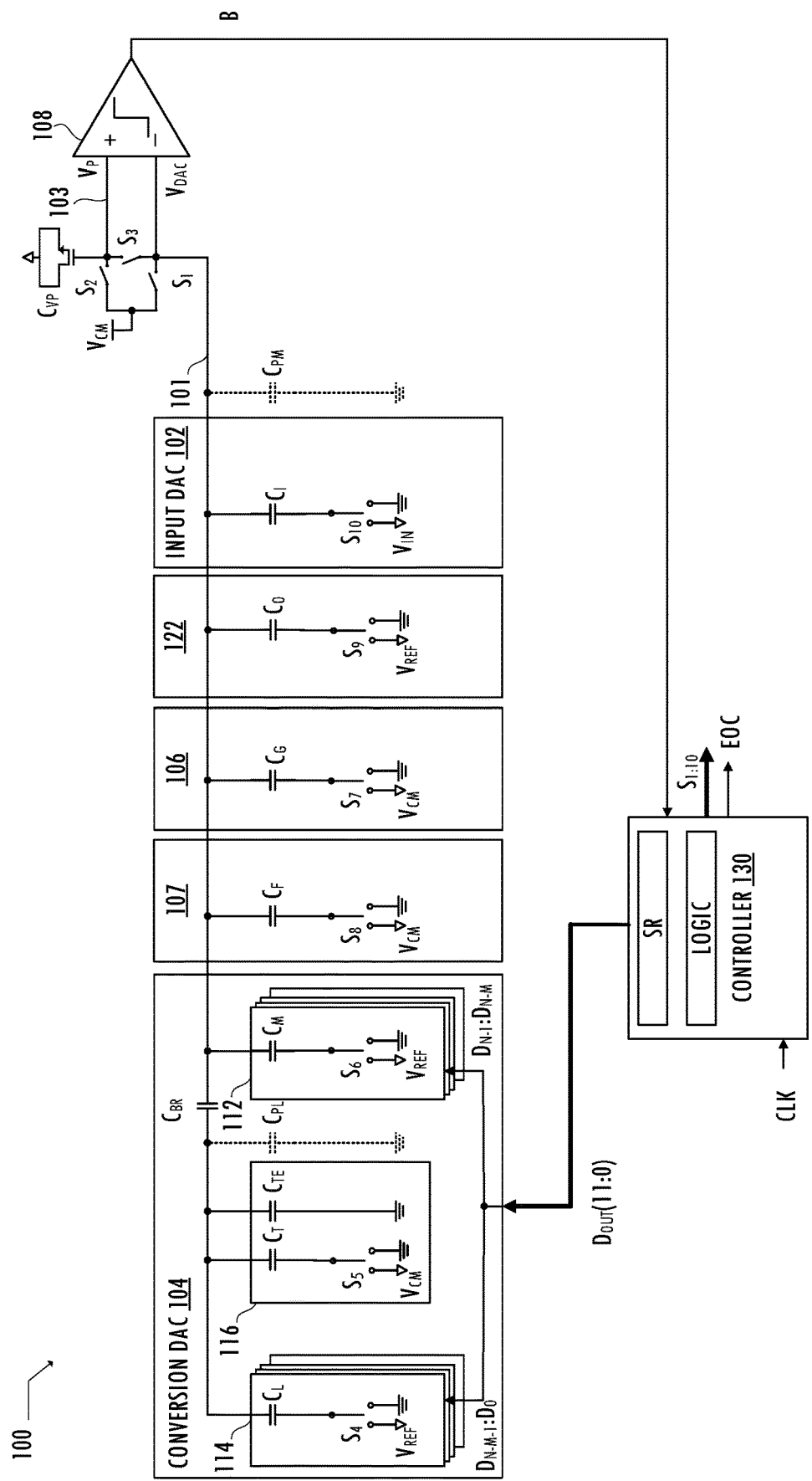
FIG. 6 illustrates a functional block diagram of a simplified version of the successive-approximation ADC of FIG. 1 configured in a conversion mode of operation consistent with at least one embodiment of the invention.

FIG. 6 is a simplified illustration of successive-approximation ADC 100 configured to operate in an analog-to-digital conversion mode of operation. Bridge tuning DAC 116 is illustrated as bridge tuning capacitor $C_T$ having a predetermined capacitance based on digital code BRIDGE CAL [$M_5$:0]. In the analog-to-digital conversion mode of operation, the disabled branches of bridge tuning capacitor $C_T$ are selectively disabled (i.e., coupled to analog signal $V_{CM}$ during sampling and then floated before sampling ends) or enabled (i.e., coupled to the ground node) by switches $S_5$ according to different phases and settings of the analog-to-digital conversion. Branches of input DAC 102 are illustrated as input capacitances $C_I$. Capacitive branches that are enabled according to the predetermined input division code to provide a predetermined input division are coupled to the input signal during sampling and are floated after sampling ends and then coupled to ground for sharing and conversion phases. Branches of input DAC 102 that are disabled according to a predetermined input division code are coupled to ground. In the conversion mode of operation, the enabled branches of input DAC 102 are selectively coupled to an input node and the ground node by switches $S_{10}$ according to different phases of the analog-to-digital conversion. Switches $S_{10}$ couple unselected branches to ground during all phases of the analog-to-digital conversion. Similarly, branches of gain tuning DAC 106 and fine gain tuning DAC 107 that are enabled according to a predetermined gain calibration code and fine gain calibration code, respectively, provide gain tuning capacitances $C_G$ and $C_F$, are illustrated as capacitances. Branches of gain tuning DAC 106 and fine gain tuning DAC 107 that are disabled according to a predetermined calibration code are coupled to analog signal $V_{CM}$ to discharge and then float during a sampling phase in the analog-to-digital conversion mode of operation. The enabled branches of gain tuning DAC 106 and fine gain tuning DAC 107 are coupled to the ground node by switches $S_7$ and $S_8$, respectively, according to different phases of the analog-to-digital conversion. All branches of gain tuning capacitances $C_G$ are floated during the conversion phase by opening switch $S_7$.

Figure 7:
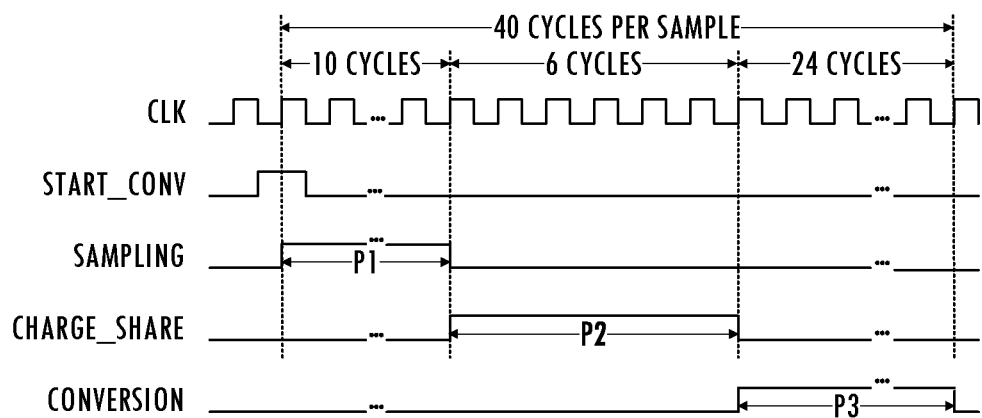
FIG. 7 illustrates timing waveforms for an analog-to-digital conversion of an input analog signal by the successive-approximation ADC of FIGS. 1 and 6 consistent with at least one embodiment of the invention.

Referring to FIGS. 6 and 7, both input nodes of comparator 108 are selectively coupled to analog signal $V_{CM}$, thereby cancelling common mode noise at the input of comparator 108. In normal analog-to-digital conversion operation, programmable capacitances implemented by gain tuning DAC 106, fine gain tuning DAC 107, offset DAC 122, and bridge tuning DAC 116 have values predetermined by digital codes that are determined during a calibration operation and are fixed during normal operation (i.e., analog-to-digital conversion), as described above. Controller 130 manipulates switches $S_5$, $S_7$, $S_8$, $S_9$, and $S_{10}$ for the enabled branches to sequentially transition through phases of analog-to-digital conversion. In at least one embodiment, controller 130 includes a shift register, logic gates, registers or flip-flops configured to perform successive-approximation consistent with the description herein.

In an exemplary embodiment, successive-approximation ADC 100 uses three phases of operation for each analog-to-digital conversion of an input analog signal: sampling phase P1, charge-sharing phase P2, and conversion phase P3. Charge-sharing phase P2 adjusts the gain of successive-approximation ADC 100. Controller 130 generates switch control signals $S_{1:10}$ to configure corresponding circuits according to the phases of operation. As discussed above, input capacitance $C_I$ is intentionally larger than needed and gain tuning capacitance $C_G$ adjusts the gain during charge-sharing phase P2. In an exemplary embodiment, the number of bits in digital code $D_{OUT}$ is twelve bits (i.e., N=12), sampling phase P1 is ten clock cycles, charge-sharing phase P2 is six clock cycles, and conversion phase P3 is 24 clock cycles (i.e., N×2). Conversion DAC 104 is implemented using MDAC 112 controlled by the six most-significant bits of the digital code, LDAC 114 that is controlled by the six least-significant bits of the digital code, and an analog-to-digital conversion of an input analog signal uses 40 cycles of clock signal CLK per conversion. However, the number of clock cycles varies with N.

Sampling phase P1 occurs in cycles 1-10 of an analog-to-digital conversion (e.g., the first ten cycles of the analog-to-digital conversion). Controller 130 removes any offset using conversion capacitors to remove a positive offset and removes any negative offset using offset capacitance $C_O$ provided by a separate offset DAC 122. If conversion capacitors are configured to remove a positive offset, the branches enabled using OFFSET[$M_4$:0] will couple to reference voltage $V_{REF}$, using switches $S_4$ and $S_6$, instead of being switched to ground during sampling. Offset capacitance $C_O$ will always be coupled to ground by switch $S_9$ during sampling. At the end of the eighth cycle of clock signal CLK, controller 130 floats unused branches of gain tuning capacitance $C_G$, fine gain tuning capacitance $C_F$, and bridge tuning capacitance $C_T$. At the end of the tenth cycle of clock signal CLK, switches $S_1$, $S_2$, and $S_3$ are opened. Controller 130 opens switches $S_1$ and $S_2$ first, which may produce an error on nodes 101 and 103 due to charge injection from opening the switches. Since switch $S_3$ is still closed, charge will distribute between nodes 101 and 103, cancelling that error. After a relatively small delay (e.g., a few nanoseconds), controller 130 opens switch $S_3$, disconnecting nodes 101 and 103. At this point, sampling is done.

Charge-sharing phase P2 occurs in cycles 11-16 of the analog-to-digital conversion. In the next cycle (i.e., cycle 11), controller 130 opens switch $S_{10}$, disconnecting input DAC 102 from the input source. In cycle 12, controller 130 closes switch $S_{10}$, thereby coupling input DAC 102 to ground, causing charge redistribution. In the eleventh cycle of clock signal CLK, the offset due to charge injection from switches $S_1$, $S_2$, and $S_3$ is stored by autozero in comparator 108. At the end of the eleventh cycle of clock signal CLK, autozero switches inside comparator 108 (not shown) are disconnected. Switch $S_{10}$ has an extra delay since switch $S_{10}$ is a high voltage switch and will be disconnected after switch $S_1$ and the autozero switches. Although controller 130 concurrently turns off autozero switches and sampling switch $S_{10}$, auto-zero switches will open first and thus any charge injection from opening switch $S_{10}$ will not be stored by comparator auto-zero circuit. This charge injection error will be removed in the next cycle when switch $S_{10}$ couples to ground, thus discharging any charge injected from the previous cycle. At the twelfth cycle of clock signal CLK, controller 130 couples input capacitance $C_I$ to ground and input charge is shared to other capacitances. Charge sharing occurs during cycles 12-15 of clock signal CLK. At the end of the fifteenth cycle of clock signal CLK, controller 130 floats gain tuning capacitor $C_G$. After floating gain tuning capacitor $C_G$ (e.g., in cycle 15.5 of clock signal CLK), controller 130 switches all switches in conversion DAC 104 (e.g., $S_4$ and $S_6$) to ground except for the most-significant branch switch of MDAC 112 (part of the $S_6$ switches), which are coupled to reference voltage $V_{REF}$ to start the conversion. Capacitive branches with switches $S_4$ and $S_6$ of conversion DAC 104 that were coupled to reference voltage $V_{REF}$ according to OFF SET[$M_4$:0] switched to ground inject a negative offset to cancel any positive offset. If offset capacitance $C_O$ is configured to cancel a negative offset using code NOFFSET[$M_3$:0], those capacitive branches will switch from ground to reference voltage $V_{REF}$ at cycle 15.5 until the end of the conversion phase, thus causing a positive offset at node 101 that can cancel any negative offset. In at least one embodiment, successive-approximation ADC 100 uses limited capacitors in offset capacitance $C_O$ (e.g., one capacitor) to obtain a large positive offset at node 101 and can use the capacitors in conversion DAC 104 to create another offset in the opposite direction (i.e., a negative offset) so that the total offset is a smaller positive offset. That technique reduces the number of capacitors in offset DAC 122, thereby reducing attenuation of the signal swing at node 101 and reducing the number of switches and associated circuitry.

Conversion phase P3 occurs in cycles 16-40 of the exemplary analog-to-digital conversion. Controller 130 sequentially determines the value of each bit of digital code $D_{OUT}$[N−1:0] based on the output of comparator 108. Determination of the value of each bit of digital code $D_{OUT}$ takes two cycles of clock signal CLK, including 1.5 cycles to switch a current bit being determined to reference voltage $V_{REF}$ and settle, and half of a cycle of clock signal CLK to latch the comparator output and switch the bit back to ground, if appropriate. Assuming a unipolar conversion for simplicity, controller 130 starts a first cycle of conversion by assuming that $D_{OUT}$[N−1] (the most-significant bit of digital code $D_{OUT}$[N−1:0]) is '1' and all other bits are '0' and applies that digital code to conversion DAC 104, which generates analog signal $V_{DAC}$ of 0.5×$V_{REF}$. Comparator 108 compares analog signal $V_{DAC}$ to the common mode voltage sampled at node 103 (e.g., analog signal $V_P$). If digital signal B is high (e.g., $V_P$>$V_{DAC}$), then controller 130 concludes that the input voltage (i.e., the sampled voltage) is higher than 0.5×$V_{REF}$ (i.e., the conversion voltage) and maintains the value of $D_{OUT}$[N−1] at '1.' If digital signal B is low (e.g., $V_P$<$V_{DAC}$), then controller 130 resets $D_{OUT}$[N−1] (i.e., changes $D_{OUT}$[N−1] to '0'). At this point, the value of $D_{OUT}$[N−1] is known.

Controller 130 continues the successive-approximation by applying a next value of digital code $D_{OUT}$ to conversion DAC 104, with $D_{OUT}$[N−1] having the known value, the next adjacent lower bit, i.e., $D_{OUT}$[N−2], assumed to have a value of '1,' and all other remaining bits having a value of '0' (except $D_{OUT}$[N−1]). Controller 130 applies that updated value of digital code $D_{OUT}$[N−1:0] to conversion DAC 104. Controller 130 compares the sampled input signal to the updated output of conversion DAC 104. If digital signal B generated by comparator 108 is high, then controller 130 maintains $D_{OUT}$[N−2] at '1.' If digital signal B is low, then controller 130 resets $D_{OUT}$[N−2] (i.e., changes this next adjacent lower bit to '0'). Controller 130 continues this process until values for all bits of digital code $D_{OUT}$[N−1:0] have been decided in succession. At that time, controller 130 asserts an end of conversion signal (EOC). The conversion phase of an analog-to-digital conversion converges to an analog output of conversion DAC 104 that is closest to the sampled input analog signal using N approximations for an N-bit digital code. In an embodiment of successive-approximation ADC 100, determination of each bit of the digital code requires two cycles of a clock signal CLK. However, in other embodiments, successive-approximation ADC 100 uses other numbers of cycles of clock signal CLK or the unipolar conversion is extended to bipolar conversion by using a sign bit to choose either +$V_{REF}$ or −$V_{REF}$.

Figure 8:
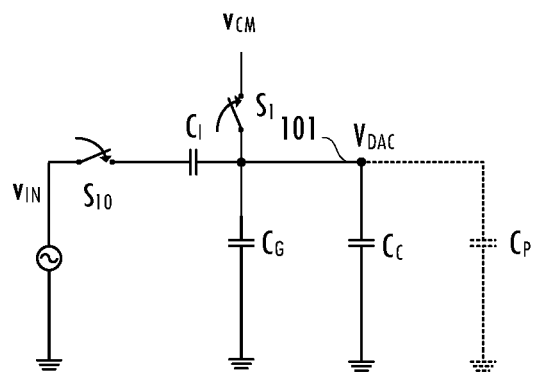
FIG. 8 illustrates a further simplified circuit diagram of the successive-approximation ADC of FIG. 6 configured in a sampling phase of the analog-to-digital conversion consistent with at least one embodiment of the invention.
Figure 9A:
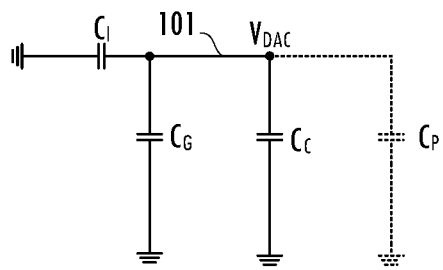
FIGS. 9A and 9B illustrate further simplified circuit diagrams of the successive-approximation ADC of FIG. 6 configured in a charge distribution phase of the analog-to-digital conversion consistent with at least one embodiment of the invention.
Figure 9B:
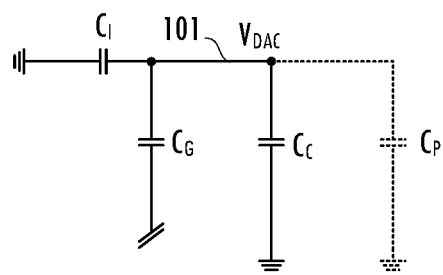
Figure 10:
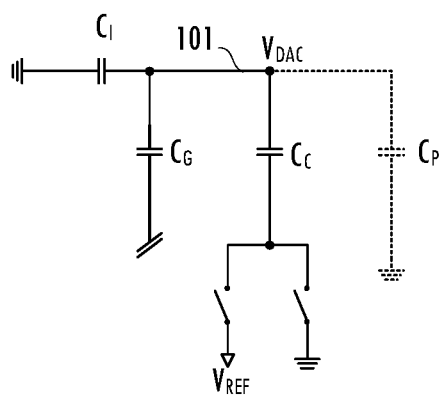
FIG. 10 illustrates a further simplified circuit diagram of the successive-approximation ADC of FIG. 6 configured in a conversion phase of the analog-to-digital conversion consistent with at least one embodiment of the invention.

FIGS. 8-10 illustrate further simplified versions of successive-approximation ADC 100 having conversion capacitance $C_C$, which represents the combination of capacitance $C_M$ of MDAC 112, conversion capacitance $C_L$ of LDAC 114, and bridge capacitor $C_{BR}$. During sampling phase P1, switch $S_{10}$ couples input capacitance $C_I$ to input analog signal $V_{IN}$ and closes switch $S_1$ to couple analog signal $V_{CM}$ to node 101, which is coupled to an input of comparator 108. As a result, the sampled charge on node 101 is $$q_{VDAC1}=(V_{CM}-V_{IN})C_I+V_{CM}(C_G+C_C)=V_{CM}(C_I+C_G+C_C)-V_{IN}C_I.$$

Controller 130 opens switch $S_1$ at the end of sampling phase P1 and before opening switch $S_{10}$ on the bottom plate of input capacitance $C_I$. This controls charge injection across input capacitance $C_I$ since switch $S_1$ is small and is always coupled to analog signal $V_{CM}$ during sampling causing charge injection to be independent of the input analog voltage. Charge injection from switch $S_1$ and switch $S_2$ is canceled because node 101 and node 103, respectively, are both coupled together by switch $S_3$. Any error is dependent on mismatch of the capacitance between nodes 101 and 103. In at least one embodiment, a prolonged auto-zeroing period of comparator 108 cancels that error. Charge injection from switch $S_{10}$ on the bottom plate of input capacitance $C_I$ is large and voltage dependent but is inconsequential since node 101 is floating (i.e., switch $S_1$ is open) when switch $S_{10}$ is opened.

FIGS. 6, 9A, and 9B, illustrate charge-sharing phase P2. Switch $S_{10}$ couples input capacitance $C_I$ to ground for charge redistribution (FIG. 9A):

$$q_{VDAC2}=(V_{DAC2}-0)(C_I+C_G+C_C)=v_{DAC2}(C_I+C_G+C_C).$$

After charge redistribution, controller 130 disconnects bottom plates of gain tuning capacitance $C_G$, causing the nodes to float (FIG. 9B). The floating nodes of gain tuning capacitance $C_G$ triggers charge injection from switches $S_7$ in the branches of gain tuning DAC 106, but switches $S_7$ were grounded before they are opened, causing the charge injection to be constant in response to any variation in the input analog signal and only depending on temperature and power supply voltage, (i.e., the internally-regulated driving voltage for switches $S_7$). Since gain tuning capacitance $C_G$ is floating, node 101 sees only the remaining charge on input capacitance $C_I$ and conversion capacitance $C_C$ and not the charge on gain tuning capacitance $C_G$:

$$q_{VDAC3}=v_{DAC3}(C_I+C_C).$$

The charge on node 101 after sampling phase P1 equals the charge on node 101 after charge-sharing phase P2. (i.e., there is no way for the charge to disappear). Therefore:

$$q_{VDAC1}=q_{VDAC2};$$

$$V_{CM}(C_I+C_G+C_C)-V_{IN}C_I=v_{DAC2}(C_I+C_G+C_C);$$

$$v_{DAC2}=V_{CM}-V_{IN}\frac{C_I}{C_I+C_G+C_C}.$$

After floating gain tuning capacitance $C_G$, only the charge on input capacitance $C_I$ and conversion capacitance $C_C$ remains on node 101:

$$q_{VDAC3} = V_{CM}(C_I + C_C) - V_{IN}\frac{C_I(C_I + C_C)}{C_I + C_G + C_C}.$$

Referring to FIGS. 6, 7, and 10, in conversion phase P3, gain tuning capacitance $C_G$ remains floating. The charge on node 101 during conversion phase P3 is:

$$q_{VDAC4} = (v_{DAC4} - V_{REF})C_C + v_{DAC4}C_I;$$

$$q_{VDAC4} = v_{DAC4}(C_I + C_C) - V_{REF}C_C.$$

There is no way for the charge to disappear between the end of charge-sharing phase P2 (i.e., after floating gain tuning capacitance $C_G$) and conversion phase P3. Charge stored on the gain tuning capacitance $C_G$ is sequestered from the conversion DAC in conversion phase P3. Therefore:

$$q_{VDAC3} = q_{VDAC4};$$

$$V_{CM}(C_I + C_C) - V_{IN}\frac{C_I(C_I + C_C)}{C_I + C_G + C_C} = v_{DAC4}(C_I + C_C) - V_{REF}C_C;$$

$$v_{DAC4} = V_{CM} - V_{IN}\frac{C_I}{C_I + C_G + C_C} + V_{REF}\frac{C_C}{C_I + C_C}.$$

Thus, the use of the gain tuning capacitance $C_G$ lowers the gain of the sampled input analog signal, i.e., if there is a mismatch between input capacitance $C_I$ and conversion capacitance $C_C$, then gain tuning capacitance $C_G$ adjusts the full-scale range of the conversion. Calibration of gain tuning capacitance $C_G$ ensures that the fractions are equal so that a full-scale range of input analog signal $V_{IN}$ equals a value of reference voltage $V_{REF}$. In at least one embodiment of successive-approximation ADC 100, this technique is also used to compensate for an offset reference voltage $V_{REF}$ by sampling an accurate external full-scale voltage on the input of successive-approximation ADC 100.

In at least one embodiment, the successive-approximation ADC of FIG. 1 implements self-calibration and self-testing modes of operation. These modes of operation utilize hardware of the successive-approximation ADC (including the DACs, switches, and comparator) and introduce additional logic that the successive-approximation ADC uses to characterize itself and calibrate unwanted effects, thereby improving performance. The additional logic can be integrated on an integrated circuit die using core devices (which uses smallest form factor process devices and adds a small to negligible increase in total area of the integrated circuit) or in software with more control over the successive-approximation ADC (e.g., switches). These additional operating modes maintain operation of the successive-approximation ADC in its normal sequence but will control the state of capacitive switches during different phases. For example, during conversion mode, the self-calibration or self-testing modes of operation force the conversion capacitors to a predetermined state instead of performing binary searching. The calibration DACs can use dummy capacitances typically present around the conversion and sampling capacitances to improve their matching, which can further reduce the cost of calibration hardware.

The cost of any additional hardware (e.g., additional switches or control registers) will be offset by cost savings these modes introduced in production testing of the successive-approximation ADC and performance gains introduced by the self-calibration and self-testing modes of operation. In addition, these operation modes can be adapted to various applications, e.g., using self-calibration to recalibrate the successive-approximation ADC in response to changes to environmental parameters (e.g., supply level, temperature, aging, etc.), and thus, further enhance performance with the successive-approximation ADC operating under varying environmental parameters that were not achievable with other successive-approximation ADC architectures or when successive-approximation ADC is calibrated only under specific conditions or the same calibration is used over a wide range of environmental parameters (e.g., calibrate at room temperature and use the same calibration code over an operating temperature range of −40 C to 125 C). Although the following calibration and self-diagnostic techniques are described in sequence, note that the sequence can vary with variation of the DAC implemented in the successive-approximation ADC. For example, a DAC with thermally coded branches will have a sequence different from a DAC with binary coded branches. The DAC conversion sequence of any embodiment can be adapted to be consistent with the techniques described herein.

Figure 11:
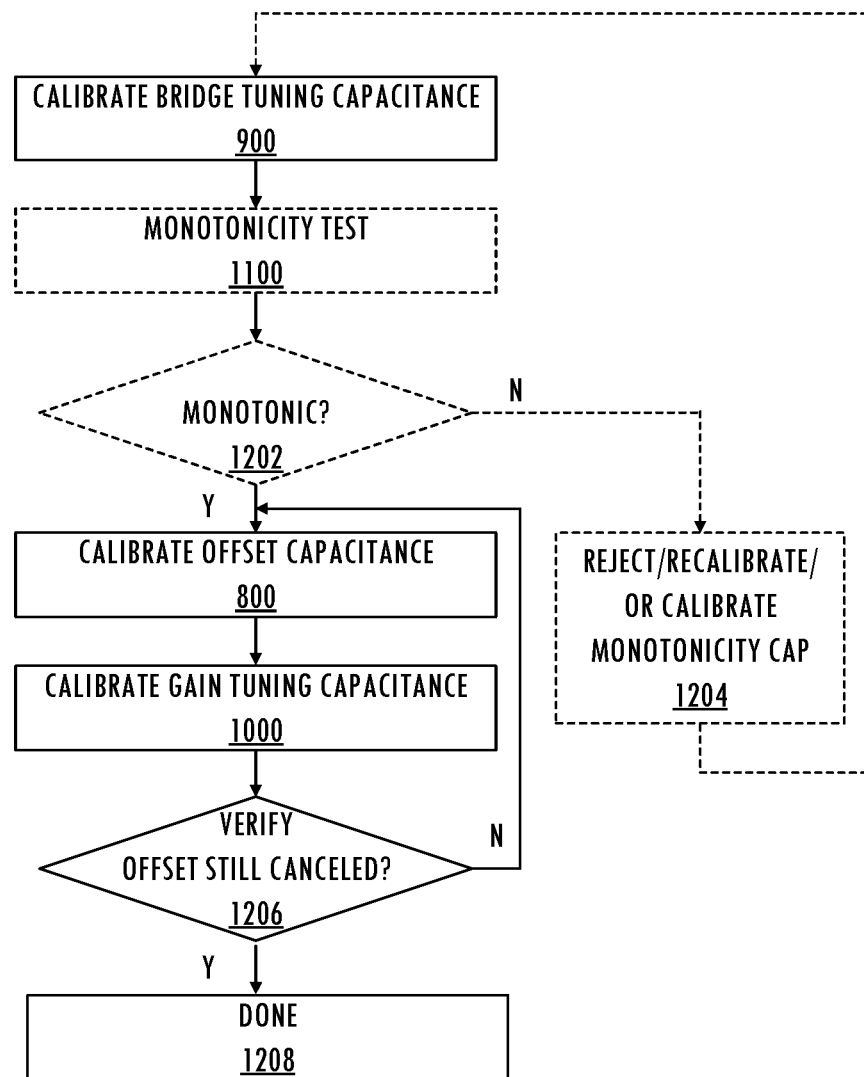
FIG. 11 illustrates information and control flows for a calibration and diagnostic mode of operation of the successive-approximation ADC of FIG. 1 consistent with at least one embodiment of the invention.

Referring to FIGS. 1 and 11, in at least one embodiment, controller 130 configures successive-approximation ADC 100 in a calibration mode of operation and determines digital codes for at least one programmable DAC used to implement a corresponding capacitance, e.g., one or more digital codes for programming gain tuning DAC 106, fine gain tuning DAC 107, bridge tuning DAC 116, offset DAC 122, or other programmable features (e.g., a pre-charge of conversion DAC 104 to implement an offset voltage). Controller 130 calibrates bridge tuning capacitance $C_T$ and stores a bridge tuning code in a corresponding register, e.g., BRIDGE CAL[$M_5$:0] (900). Any predetermined bridge tuning codes are used in later calibrations, e.g., offset capacitance calibration 800 or gain tuning capacitance calibration 1000, or any diagnostic tests, e.g., monotonicity test (1100). In at least one embodiment, controller performs monotonicity test 1100. If monotonicity test 1100 indicates that successive-approximation ADC 100 is monotonic (1202), then successive-approximation ADC 100 continues with other calibration of programmable features for finishing manufacture of the product. If monotonicity test 1100 indicates that successive-approximation ADC 100 is non-monotonic (1202), then controller 130 provides an indicator and the part may be rejected based on that indicator, controller 130 initiates recalibration of the bridge tuning capacitance, controller 130 initiates calibration of a monotonicity tuning capacitance, or combination thereof (1204).

In at least one embodiment, if monotonicity test 1100 indicates that successive-approximation ADC 100 is non-monotonic (1202), controller 130 initiates a calibration of a monotonicity capacitance (e.g., implemented by a capacitive DAC). A monotonicity tuning DAC (not shown) provides monotonicity tuning capacitances that are coupled to MDAC 112 or LDAC 114. The monotonicity tuning capacitance are a fraction of a unit capacitance and are selectively enabled (e.g., using three-way switches between capacitive branches and reference voltage $V_{REF}$ and ground) for branches of conversion DAC 104 that fail the monotonicity test. When the monotonicity tuning capacitances are not used, they are coupled to ground (acting similar to a parasitic capacitance on that node) or coupled to analog signal $V_{CM}$ and floated during sampling (e.g., similar to unused capacitive branches in bridge tuning DAC 116 and gain tuning DAC 106). The latter reduces the signal attenuation and may improve performance of successive-approximation ADC 100. Enabling a capacitive branch of a monotonicity DAC together with a capacitive branch in MDAC 112 or LDAC 114 increases the effective capacitive value of that capacitive branch since both branches will switch to the same state (e.g., $V_{REF}$ or ground) together and provide an effective capacitance equal to a summation of the corresponding capacitances. This technique increases the effective capacitance of a corresponding branch of conversion DAC 104 to achieve monotonicity. Controller 130 stores a digital code for the monotonicity DAC for use in an analog-to-digital conversion mode of operation. After calibrating any monotonicity capacitance, controller 130 reruns the monotonicity test (1100) or recalibrates the bridge tuning capacitance of successive-approximation ADC 100.

If monotonicity test 1100 indicates that successive-approximation ADC 100 is monotonic (1202), controller 130 calibrates any offset capacitances (800) and stores the corresponding digital codes in associated registers, e.g., NOFFEST[$M_3$:0] or OFFEST[$M_4$:0]. The digital codes for the offsets are used to configure offset DAC 122 or pre-charge of conversion DAC 104. The digital codes for any offset capacitances and bridge tuning capacitance $C_T$ are then used in subsequent calibrations. Controller 130 calibrates gain tuning capacitances and controller 130 stores a gain tuning code in a corresponding register, e.g., GAIN CAL[$M_2$:0] or FINE GAIN CAL [$M_6$:0] (1000). In at least one embodiment, controller 130 verifies that after calibrating the gain tuning capacitance, digital codes NOFFEST[$M_3$:0] or OFFEST[$M_4$:0] still cancel any offset of successive-approximation ADC 100 (1206). If the offset is non-zero, controller 130 recalibrates the offset capacitance (800). If controller 130 does not detect a substantial offset, controller 130 completes calibration (1208). After determining digital codes for the programmable capacitances, those codes are used to configure corresponding capacitances (e.g., implemented using capacitive DAC) or configures successive-approximation ADC 100 for analog-to-digital conversion.

Figure 12:
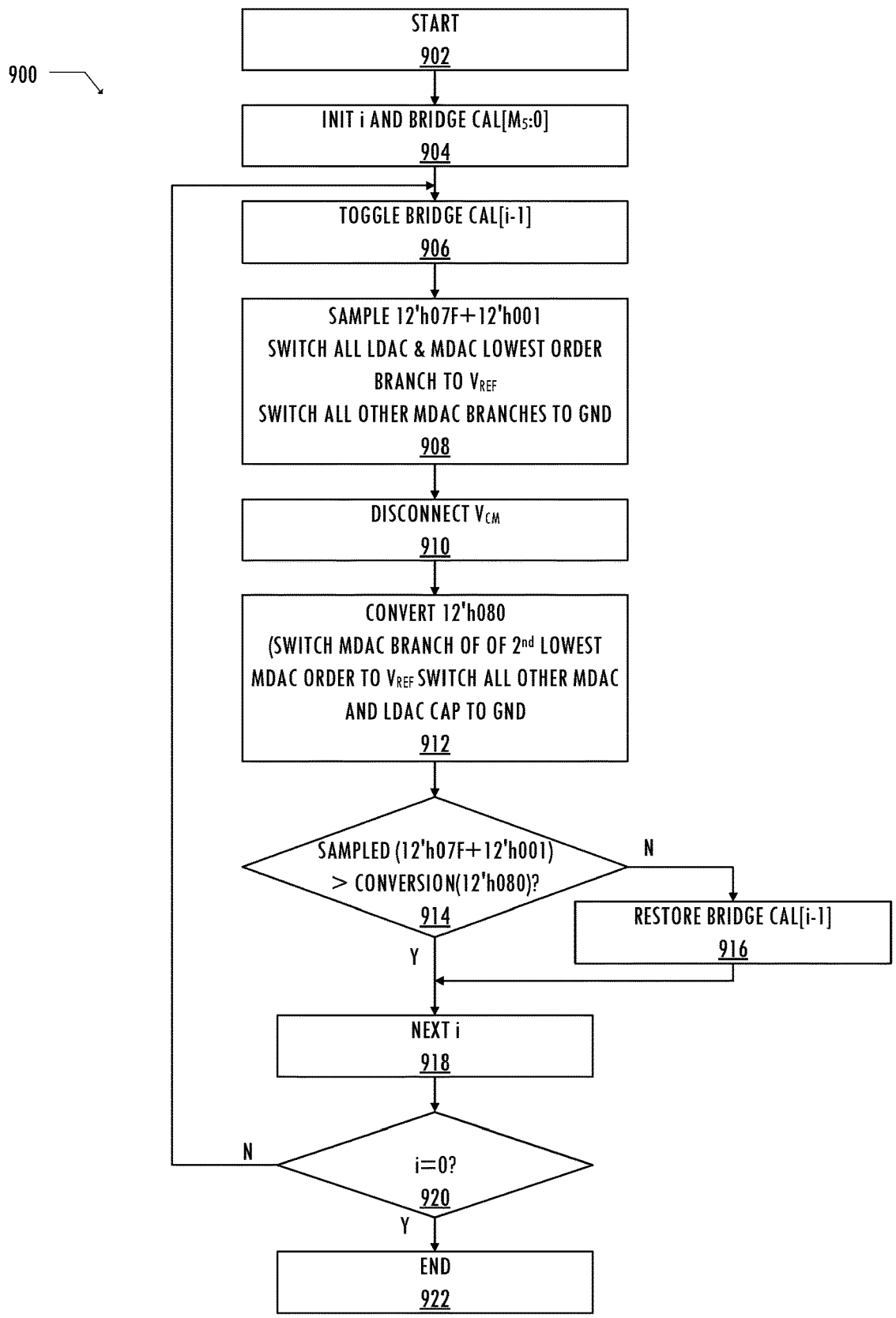
FIG. 12 illustrates information and control flows for calibration of a bridge tuning capacitance of the successive-approximation ADC of FIG. 1 consistent with at least one embodiment of the invention.
Figure 13A:
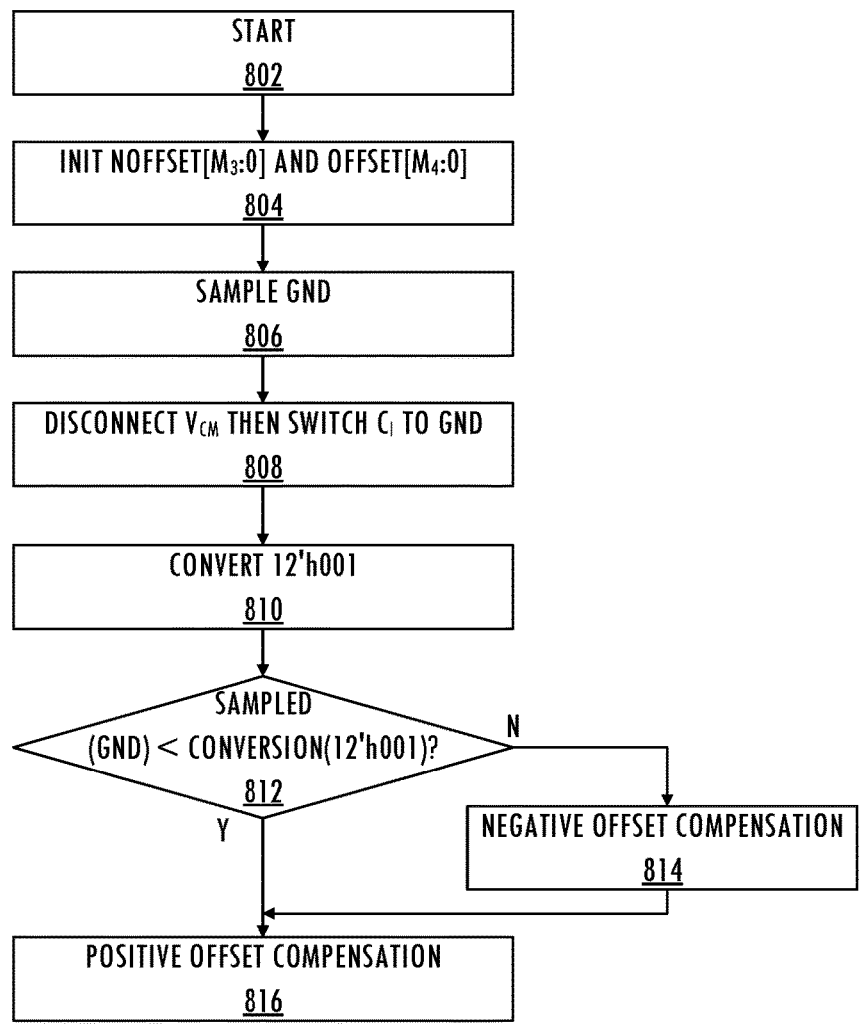
FIG. 13A illustrates information and control flows for calibration of an offset capacitance of the successive-approximation ADC of FIG. 1 consistent with at least one embodiment of the invention.
Figure 13B:
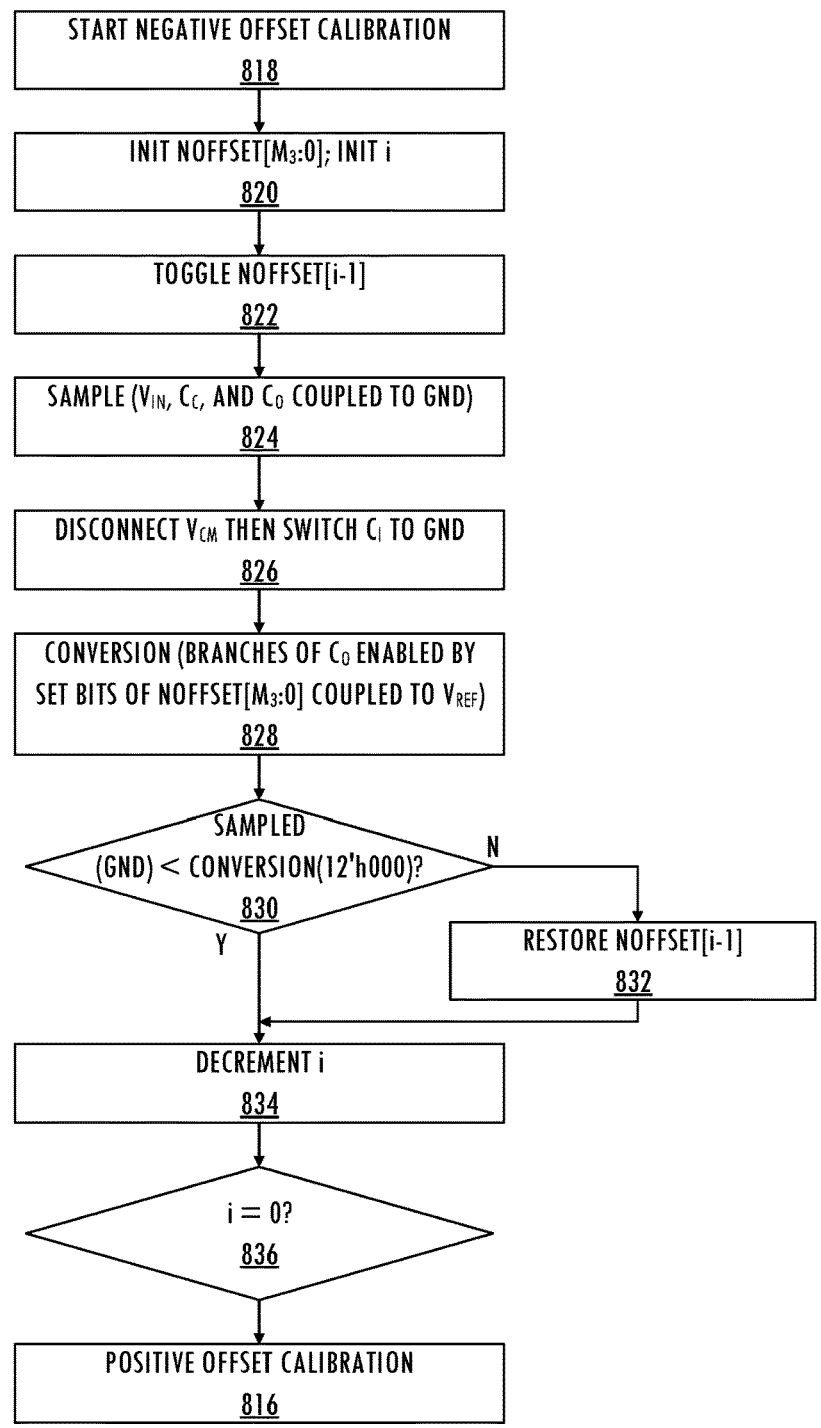
FIG. 13B illustrates information and control flows for calibration of a negative offset capacitance of the successive-approximation ADC of FIG. 1 consistent with at least one embodiment of the invention.
Figure 13C:
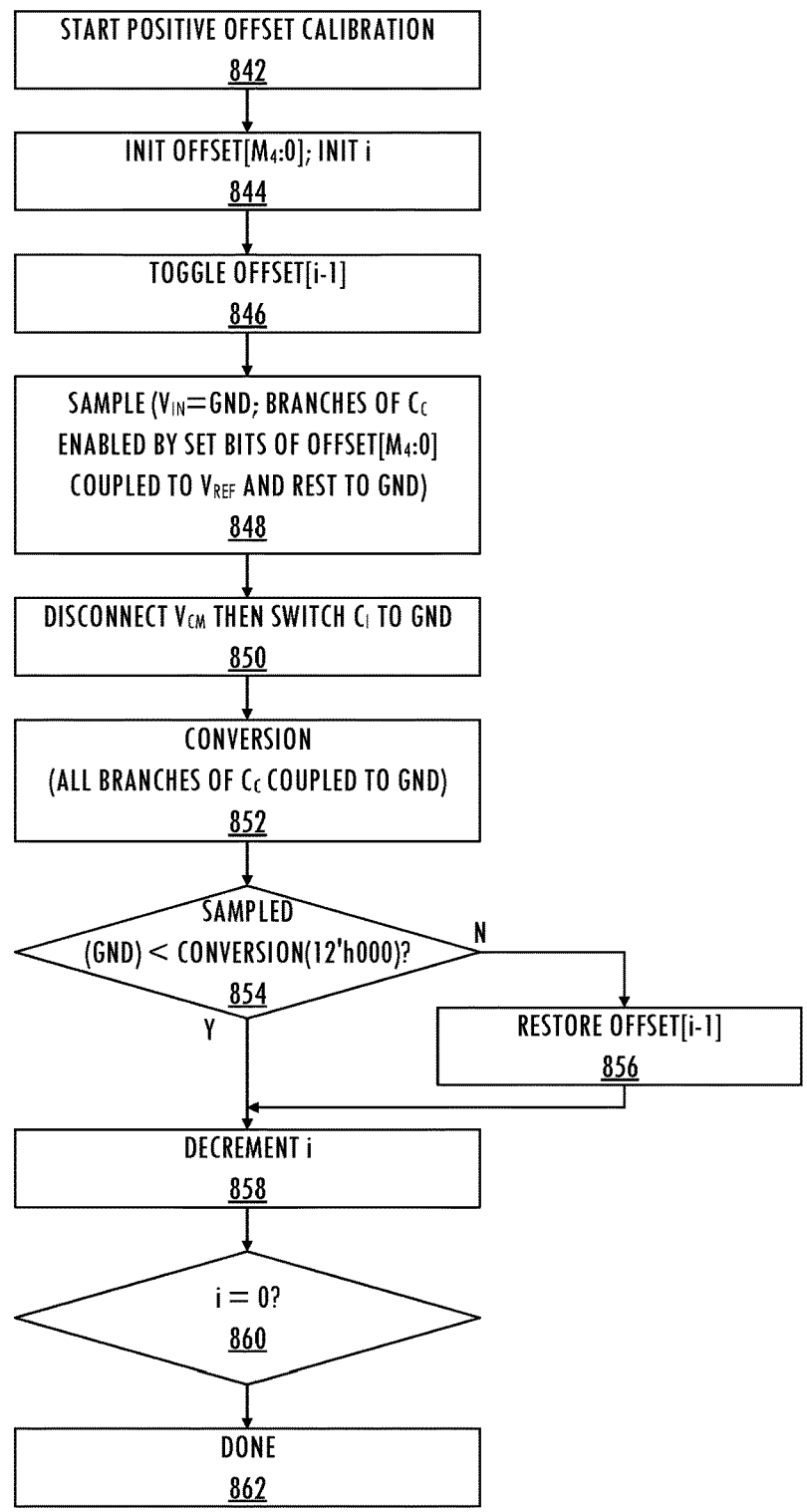
FIG. 13C illustrates information and control flows for calibration of a positive offset capacitance of the successive-approximation ADC of FIG. 1 consistent with at least one embodiment of the invention.

Referring to FIGS. 1 and 12, in at least one embodiment of successive-approximation ADC 100, controller 130 calibrates the bridge tuning capacitance $C_T$ (900). In an exemplary embodiment, the least-significant bit of MDAC 112 is 12'h040 and the target of the bridge tuning capacitor calibration is to match 12'h07F+12'h001 to 12'h080. Controller 130 begins calibration of the bridge tuning capacitor (902) and initializes index i to point to the most-significant end of digital code BRIDGE CAL[$M_5$:0], e.g., to $M_5$+1, where $M_5$ corresponds to the most-significant bit of digital code BRIDGE CAL[$M_5$:0], which is a control code for programming bridge tuning capacitance $C_T$ of bridge tuning DAC 116 (904). In addition, controller 130 initializes each bit of digital code BRIDGE CAL[$M_5$:0] according to a predetermined digital value (e.g., '0'). Controller 130 floats input capacitance $C_I$, fine gain tuning capacitance $C_F$, and coarse gain tuning capacitance $C_G$ during bridge tuning capacitance calibration since their values will not affect the calibration. Floating input capacitance $C_I$, fine gain tuning capacitance $C_F$, and coarse gain tuning capacitance $C_G$ improves voltage swing at the input of comparator 108. Controller 130 toggles (e.g., sets to '1') bit i−1 of digital code BRIDGE CAL[$M_5$:0] (906). Switches $S_1$ and $S_2$ couple node 101 and node 103, respectively, to analog signal $V_{CM}$. During the sampling phase, controller 130 configures conversion DAC 104 to enable all branches of LDAC 114 (including its terminal capacitance) and a lowest order branch of MDAC 112 by coupling the corresponding capacitive branches to reference voltage $V_{REF}$ and coupling other capacitive branches of conversion DAC 104 to ground. Controller 130 closes switches $S_1$, $S_2$, and $S_3$, and samples reference voltage $V_{REF}$ on branches of LDAC 114 and a lowest order branch of MDAC 112 (908). After sufficient sampling time, controller 130 opens switches $S_1$ and $S_2$, and after a slight delay, opens switch $S_3$, thereby disconnecting analog signal $V_{CM}$ (910). The voltage on node 101 is:

$$V_{DAC} = V_{CM} - \frac{(12'h07F + 12'h001)}{(12'hFFF + 12'h001)} \times V_{REF}.$$

Then, controller 130 couples all branches of LDAC 114, including the terminal capacitor branch, and MDAC 112 to ground, and couples the branch of MDAC 112 that corresponds to the second lowest order branch of MDAC 112 to the reference voltage $V_{REF}$ (912):

$$V_{DAC} = V_{CM} - \frac{(12'h07F + 12'h001)}{(12'hFFF + 12'h001)} \times V_{REF} + \frac{(12'h080)}{(12'hFFF + 12'h001)} \times V_{REF}.$$

Comparator 108 compares the voltage on nodes 101 and 103. If the voltage comparison indicates that the voltage on node 101 is greater than the voltage on node 103 (i.e., $V_{DAC} \geq V_P$) (914), then the sampled value of 12'h07F+12'h001 is smaller than the conversion value for the conversion of 12'h080 (i.e., the value was attenuated more than desired) and controller 130 restores bit i−1 to the predetermined digital value (e.g., clears bit i if initialized to '0') of digital control code BRIDGE CAL (916).

If the comparison indicates that the voltage on node 101 is less than the voltage on node 103 (i.e., $V_{DAC} > V_P$) (914), then controller 130 determines the next index i (e.g., decrements i) (918). If index i is greater than the index for the least-significant branch of bridge tuning DAC 116 (i.e., i=0) (920), then controller 130 repeats steps 906-920 for a next value of index i (i.e., next branch of bridge tuning capacitance $C_T$). Each step tests an increase of bridge tuning capacitance $C_T$ by an amount that is less than in the step before, e.g., each successive step will increase bridge tuning capacitance $C_T$ by a value that is half the value of the previous step. Each bridge capacitance calibration bit tests an attenuation level that is smaller than the previous step. If index i equals the index for the least-significant branch of bridge tuning DAC 116 (i.e., i=0) (918), then the calibration of the bridge capacitor is finished and a control code for bridge tuning DAC 116 is stored as digital code BRIDGE CAL [$M_5$:0] (922). The calibration of the bridge tuning capacitor results in LDAC 114 and a lowest order branch of MDAC 112 plus error equaling the second lowest order branch of MDAC 112, i.e., LDAC 114 and a lowest order branch of MDAC 112 corresponds to a conversion value of conversion DAC 104 that is less than a conversion value generated in response to the second lowest order branch of MDAC 112. The resulting deviation between those corresponding adjacent analog values (i.e., the DNL error) is targeted to be less than half of the value corresponding to the lowest order branch of LDAC 114, and the range and step size of bridge tuning capacitance $C_T$ are predetermined based on this target, e.g., 12'h07F+12'h001<12'h080 by an error equivalent to a bridge tuning capacitance step.

Referring to FIGS. 1, 13A, 13B, and 13C, in at least one embodiment of successive-approximation ADC 100, controller 130 performs calibration of any offset capacitance (800). The target of the calibration is for successive-approximation ADC 100 to sample ground and generate a digital code $D_{OUT}[N-1:0]$ equal to zero (e.g., couple $V_{IN}$ to ground and generate 12'h000 where N=12). If ground noise makes that reading impractical, the calibration target is for successive-approximation ADC 100 to sample a small analog voltage and generate a corresponding digital code $D_{OUT}[N-1:0]$, (e.g., $V_{IN}$=0.005×$V_{REF}$ and target $D_{OUT}[N-1:0]$ equal to 12'h014). The offset capacitance should be calibrated at the lowest practical level to reduce any dependency on gain tuning capacitance calibration. Controller 130 begins offset capacitance calibration after bridge capacitance calibration (802). If any of the conversion capacitive branches is coupled to reference voltage $V_{REF}$ during sampling and is coupled to ground before conversion, it will inject a negative DC voltage on node 101:

$$V_{DACafter} = V_{DACbefore} - V_{REF} \times \frac{C_{C\_REF}}{C_I + C_C + C_O + C_P},$$

where $C_{C\_REF}$ is the equivalent amount of conversion capacitance on node 101 that is switched to reference voltage $V_{REF}$ during the sampling phase. An offset capacitance $C_O$ coupled to the node 101 injects a positive DC voltage on node 101 if the offset capacitance is switched from ground during the sampling phase to $V_{REF}$ during the conversion phase:

$$V_{DACafter} = V_{DACbefore} + V_{REF} \times \frac{C_O}{C_I + C_C + C_O + C_P}.$$

If offset capacitance $C_O$ is coupled to ground during sampling and conversion phases, it will behave as a parasitic capacitor. Thus, the conversion capacitive branches and offset capacitive branches can be selectively configured to compensate for an offset of successive-approximation ADC 100. Using conversion capacitance $C_C$, conversion DAC 104 injects a negative DC voltage at node 101 with a relative step value of $$\frac{V_{REF}}{2^N}.$$

Using offset capacitance $C_O$, conversion DAC 104 can inject a fixed positive DC voltage to node 101 (e.g., if $C_O$=1 CU, a value relative to $$\frac{V_{REF}}{2^6}$$

is injected). Thus, an exemplary embodiment of offset calibration 800 achieves a range of $-V_{REF}$ to $$\frac{V_{REF}}{2^6}$$

in steps of $$\frac{V_{REF}}{2^{12}}.$$

Note that for an analog-to-digital controller with a differential DAC implementation (e.g., having a conversion capacitance coupled to each input of the comparator), offset capacitance $C_O$ is omitted since a conversion DAC coupled to node 103 is configured to generate an offset in an opposing direction.

Controller 130 initializes digital codes NOFFSET[$M_3$:0] and OFFSET[$M_4$:0] by clearing their contents (804). Then, controller 130 tests whether successive-approximation ADC 100 has a negative offset. Any negative offset will cause successive-approximation ADC 100 output to be higher than a digital value corresponding to an input analog signal (e.g., if ground is coupled to input analog signal $V_{IN}$, then successive-approximation ADC 100 will generate a code greater than 12'h000). Controller 130 couples input DAC 102 to ground and configures successive-approximation ADC 100 to sample ground as input analog signal $V_{IN}$ while capacitive branches of offset DAC 122, MDAC 112, and LDAC 114, which includes the terminal capacitor, are coupled to ground (806). Input DAC 102 switches from ground received at the input analog signal $V_{IN}$ during sampling to ground during conversion (808). If there is no negative offset, then both inputs of comparator 108 will have the same voltage level. To reduce or avoid metastability conditions in the comparator from having both inputs at the same voltage level and to produce a known output value, the least significant branch (or terminal branch) of LDAC 114 is coupled to reference voltage $V_{REF}$ during conversion, and conversion DAC 104 converts 12'h001, causing node 101 to be higher than node 103 in comparator 108 by one least-significant bit (i.e., the lowest amount recognizable by successive-approximation ADC 100) (810). If successive-approximation ADC 100 does not have a negative offset (812), then comparator 108 produces a zero output. If comparator 108 generates a '1,' then a negative offset exists, and controller 130 compensates the negative offset by enabling at least one capacitive branch of offset DAC 122, to reduce or eliminate the negative offset (814).

If offset DAC 122 includes a single capacitive branch, then controller 130 enables that branch to reduce or eliminate a previously detected negative offset. When that capacitive branch is enabled, controller 130 couples that branch to ground during sampling and couples that branch to reference voltage $V_{REF}$ during conversion to inject a positive offset that reduces or eliminates the previously detected negative offset. If offset DAC 122 includes more than one capacitive branch, then controller 130 begins negative offset capacitance calibration 815 to determine digital code NOFFSET[$M_3$:0], where $M_3$+1 is an integer that corresponds to the number of capacitive branches and each bit of digital code NOFFSET[$M_3$:0] corresponds to a capacitive branch. $M_3$ corresponds to the highest order capacitive branch (i.e., the capacitive branch that can inject the largest offset) and bit 0 corresponds to lowest order capacitive branch, with other bits corresponding to capacitive branches sequentially in between the largest and smallest order capacitive branches. If a bit of the digital code is set (e.g., '1') than the capacitive branch associated with that bit will be coupled to ground during sampling and will be coupled to reference voltage $V_{REF}$ during conversion. If the bit of the digital code is clear (e.g., '0'), then the capacitive branch will always be coupled to ground. In at least one embodiment, a capacitive branch is floating (i.e., the branch is discharged during sampling by coupling both plates of the capacitor to analog signal $V_{CM}$ and floats the capacitor) when disabled.

Controller 130 begins negative offset capacitance calibration 815 (818) by initializing digital code NOFFSET[$M_3$:0] and index i. In an exemplary embodiment, initialization sets all bits of digital code NOFFSET[$M_3$:0] and sets index i equal to $M_3$+1 (820). Controller 130 toggles bit i−1 in digital code NOFFSET[$M_3$:0] (e.g., clears bit $M_3$) (822). Controller 130 couples input DAC 102 to ground and configures successive-approximation ADC 100 to sample the ground voltage while conversion DAC 104 and offset DAC 122 are coupled to ground (824). Controller 130 proceeds with the analog-to digital conversion operation (e.g., opens switches $S_1$, $S_2$, and $S_3$ to disconnect $V_{CM}$ and couples input DAC 102 to ground) (826) until it reaches the conversion phase, in which controller 130 couples all capacitive branches in conversion DAC 104 to ground and couples only those capacitive branches of offset DAC 122 that are set in digital code NOFFSET[$M_3$:0] to reference voltage $V_{REF}$. (828). If the output of comparator 108 is set (e.g., '1') (830), then the sampled offset is smaller than the injected offset of the conversion and controller 130 keeps that offset capacitance branch associated with index i−1 disabled. If the output of comparator 108 is clear (e.g., '0') (830), then the sampled offset is greater than the injected offset, and controller 130 restores bit i−1 of digital code NOFFSET[$M_3$:0] to its initialization value (e.g., '1') (832). Controller 130 determines a next value of the index i (e.g., decrements index i) (834) and proceeds to test the next capacitive branch until all branches of offset DAC 122 have been tested (836).

Next controller 130 determines if successive-approximation ADC 100 has a positive offset (816). The source of a positive offset can be inherent to successive-approximation ADC 100 or from a positive offset injected by offset DAC 122 being greater than a negative offset inherent to successive-approximation ADC 100. The latter can occur when the step size of offset DAC 122 is more than one least-significant bit of conversion capacitance. In an embodiment, offset DAC 122 includes only one capacitive branch with a step of 64 least-significant bits of positive offset injection. Such embodiments are likely to require a negative offset applied by conversion DAC 104 in addition to the positive offset applied by offset DAC 122 to reduce or eliminate the inherent negative offset.

Any positive offset will cause successive-approximation ADC 100 to output a digital value that is lower than expected. Controller 130 begins calibration for a positive offset (842) by initializing digital code OFFSET[$M_4$:0] and index i. In an exemplary embodiment, initialization clears all bits of digital code OFF SET[$M_4$:0] and sets index i equal to $M_4$+1 (844). Controller 130 toggles bit i−1 in digital code OFFSET[$M_4$:0] (e.g., sets bit $M_4$) (846). Bit $M_4$ is the highest bit of digital code OFF SET[$M_4$:0] corresponding to a highest order branch of conversion DAC 104 that participates in the offset cancellation. To check for a positive offset, controller 130 couples input DAC 102 to ground and configures successive-approximation ADC 100 to sample the ground voltage while capacitive branches of conversion DAC 104 that are enabled by set bits of digital code OFF SET[$M_4$:0] are coupled to reference voltage $V_{REF}$ and the remaining capacitive branches are coupled to ground (848). At first, this will be only the highest order branch participating in the offset cancellation. After sampling, controller will proceed with the analog-to-digital conversion until reaching the conversion phase. Controller 130 proceeds with the analog-to digital conversion operation (e.g., opens switches $S_1$, $S_2$, and $S_3$ to disconnect $V_{CM}$ and couples input DAC 102 to ground) (850) until it reaches the conversion phase.

During the conversion phase, controller 130 couples all capacitive branches in conversion DAC 104 to ground (852). Comparator 108 compares the sampled and the converted values. If the output of comparator 108 is set (e.g., '1') (854), then the sampled offset is smaller than the injected offset of the conversion and controller 130 keeps that offset capacitance branch associated with index i−1 disabled. If the output of comparator 108 is clear (e.g., '0') (854), then the sampled offset is greater than the injected offset, and controller 130 restores bit i−1 of OFFSET[$M_4$:0] to its initialization value (e.g., '0') to disable the conversion capacitor offset injection during sampling (856). Next, controller 130 decrements index i (858) and proceeds to test the next branch until all relevant branches of conversion DAC 104 have been tested (860). At the end of this process (862), digital code OFFSET[$M_4$:0] has a value that controller 130 uses to enable corresponding branches of conversion DAC 104 (i.e. switch to reference voltage $V_{REF}$) during sampling to inject a negative offset to reduce or eliminate any offset in successive-approximation ADC 100. In other embodiments the offset capacitance calibration can replace reference voltage $V_{REF}$ with a DC voltage to make the offset capacitance calibration independent of reference voltage $V_{REF}$. However, that technique requires additional switches to couple branches of the conversion capacitance to the DC voltage.

Referring to FIGS. 1, 3, 4A, 4B, 14A, 14B, 14C, in at least one embodiment of successive-approximation ADC 100, controller 130 starts gain tuning capacitance calibration 1000 after offset capacitance calibration and bridge capacitor calibration. Calibration of the gain matches the sampling range of input DAC 102 to the conversion range of conversion DAC 104. The target of gain tuning capacitance calibration is to sample reference voltage $V_{REF}$ on the input node of input DAC 102 and receive a value of digital code $D_{OUT}$ equal to 12'hFFF+12'h001 (the 12'h001 is the terminal capacitor in LDAC 114) or 13'h1000 from conversion DAC 104. If noise makes that reading impractical, the calibration can sample an analog voltage that is slightly smaller and generate a corresponding digital code $D_{OUT}$[N−1:0] (e.g., $V_{IN}$=0.995 of $V_{REF}$ and target $D_{OUT}$[N−1:0] equal to 12'hFEB). The gain tuning capacitance should be calibrated at the highest practical level to reduce dependency on offset tuning capacitance calibration. After sampling reference voltage $V_{REF}$, but before performing the binary search of the successive-approximation conversion, successive-approximation ADC 100 shares the sampled charge across all capacitors by decoupling analog signal $V_{CM}$ from node 101, decoupling input capacitance $C_I$ from input analog signal $V_{IN}$, and then coupling input capacitance $C_I$ to ground. If input capacitance $C_I$ is greater than the conversion capacitance $C_C$, then extra charge is sampled. As discussed above, gain tuning DAC 106 is a programmable capacitive DAC that is on during a charge-sharing phase of the analog-to-digital conversion. Enabled capacitive branches of gain tuning DAC 106 store that extra charge. When the gain tuning capacitance floats during the conversion phase, the gain tuning capacitance will not attenuate the conversion capacitance and sequesters that extra charge from conversion DAC 104 during the conversion phase of the analog-to-digital conversion, thereby attenuating the sampling range.

In embodiments of successive-approximation ADC 100 that couples gain tuning DAC 106 to node 101 and couples fine gain tuning DAC 107 to node 101 (FIG. 4A), controller 130 begins calibration of gain tuning capacitance 1000 (1002) by initializing each bit of GAIN CAL[$M_2$:0] according to a predetermined digital value (e.g., '1'), initializing all bits of FINE GAIN CAL[$M_6$:0] to zero, and initializing index i to point to the most-significant end of digital code GAIN CAL[$M_2$:0] (e.g., to $M_2$+1, where $M_2$ corresponds to the most-significant branch of gain tuning capacitance $C_G$, while '0' corresponds to the least-significant branch of gain tuning capacitance $C_G$). Digital code GAIN CAL[$M_2$:0] corresponds to a control code for programming gain tuning DAC 106 (1004). In an exemplary embodiment, controller 130 tests a gain setting by toggling (e.g., clearing) bit i−1 of control code GAIN CAL[$M_2$:0] corresponding to capacitive branch i−1 of gain tuning DAC 106 to selectively disable that branch (1006). Maximum possible gain attenuation is achieved when controller 130 sets every bit of GAIN CAL[$M_2$:0]. If input DAC 102, conversion DAC 104, and gain tuning DAC 106, and fine gain tuning DAC 107 are configured properly, then the conversion range will be higher than the sampling range. Controller 130 disables each capacitive branch of gain tuning DAC 106 one by one and determines whether disabling the capacitive branch makes the conversion range smaller than the sampling range. If disabling a capacitive branch of gain tuning DAC 106 makes the conversion range smaller than the sampling range, then controller 130 enables that capacitive branch again by setting (i.e., restoring) the corresponding bit of GAIN CAL[$M_2$:0]; otherwise, that capacitive branch remains disabled (i.e., the corresponding bit of GAIN CAL[$M_2$:0] remains cleared). At the end of the gain tuning capacitance calibration, the sampling range will be smaller but as close to the conversion range as realizable by the step size of gain tuning DAC 106. Next, controller 130 calibrates fine gain tuning DAC 107, if present, to further reduce the error to be less than one least-significant branch of fine gain tuning DAC 107.

In an exemplary embodiment, controller 130 configures input DAC 102 according to a target division, which depends on the level of a maximum input analog signal $V_{IN}$ and reference voltage $V_{REF}$. For example, a first division mode (e.g., unity) for input voltage $V_{IN}$ and reference voltage $V_{REF}$ equal to 2.4 V, a second division mode (e.g., ½) for a larger range of input analog signal $V_{IN}$ equal to 4.8 V and a reference voltage $V_{REF}$ equals 2.4 V, etc. Controller 130 configures input analog signal $V_{IN}$ equal to reference voltage $V_{REF}$ for calibration of the gain for a division by one. If that gain is to be calibrated for the other division modes, then the maximum of input analog signal $V_{IN}$ will be coupled to the input DAC 102. Controller 130 couples node 101 and node 103 to analog signal $V_{CM}$ and samples the input analog signal $V_{IN}$ (e.g., reference voltage $V_{REF}$ for the unity division mode) (1008).

Controller 130 couples enabled capacitive branches of gain tuning capacitance $C_G$ to ground during sampling. Disabled capacitive branches, which at the first iteration of the loop is the highest order branch of gain tuning capacitance $C_G$, and all branches of fine gain tuning capacitance $C_F$, are coupled to analog signal $V_{CM}$ during sampling. Those branches are floated before sampling ends. Capacitive branches in conversion DAC 104 and offset DAC 122 will be configured according to digital codes OFFSET[$M_4$:0] and NOFFSET[$M_3$:0]. At the end of the sampling phase, node 101 and node 103 are disconnected from analog signal $V_{CM}$ (i.e., floated) and input DAC 102 is disconnected from input analog signal $V_{IN}$ and coupled to ground, and floated for one clock cycle in between to avoid shorting the input to ground (1010). When controller 130 couples the capacitive branches of input DAC 102 to ground, charge sharing occurs and the signal on node 101 becomes:

$$V_{DAC} = V_{CM} - V_{IN} \times \frac{C_{Iin}}{C_I + C_C + C_G + C_P} = V_{CM} - V_{REF} \times \frac{C_I}{C_I + C_C + C_G + C_P},$$

for a unity division mode, and where $C_{Iin}=C_I$ and $V_{IN}=V_{REF}$.

Next, controller 130 floats switches $S_7$ of those capacitive branches enabled in gain tuning DAC 106, causing those branches to float and configures switches $S_4$ and $S_6$ of conversion DAC 104 to couple the capacitive branches in MDAC 112 and LDAC 114, including its terminal capacitance, to reference voltage $V_{REF}$ (e.g., for a digital-to-analog conversion of $D_{OUT}$=12'hFFF+12'h001) (1012). For example:

$$V_{DAC} = V_{CM} - V_{REF} \times \frac{C_I}{C_I + C_C + C_G + C_P} + V_{REF} \times \frac{C_C}{C_I + C_C + C_G + C_P}.$$

The $V_{DAC}$ input to comparator 108 has an analog value that corresponds to a swing down by sampling of the maximum input analog signal $V_{IN}$ and a swing up by the maximum of the digital-to-analog conversion $V_{DAC}$. If the value of the maximum of the digital-to-analog conversion $V_{DAC}$ is smaller than the value of the maximum sampling of the input analog signal $V_{IN}$ (i.e., $V_{DAC}<V_P$) (1014), then the conversion range covers less than the sampling range, the sampling ratio needs more attenuation, and controller 130 restores bit i−1 to the predetermined digital value (e.g., sets bit i) of digital code GAIN CAL[$M_2$:0] (1016), enabling capacitive branch i−1 of gain tuning DAC 106. Otherwise (i.e., $V_{DAC}>V_P$) (1014), the input range attenuation is more than required and bit i−1 of digital code GAIN CAL[$M_2$:0] remains at the toggled value (e.g., cleared) and controller 130 decrements index i (1018). If the least significant bit of digital code GAIN CAL[$M_2$:0] has been considered (e.g., i=0) (1020), then calibration of gain tuning capacitance $C_G$ is complete and digital code GAIN CAL[$M_2$:0] configures gain tuning DAC 106 to calibrate the gain. Controller 130 then proceeds to calibrate fine gain tuning capacitance $C_F$, if present, and determine digital code FINE GAIN CAL[$M_6$:0] (1050). Otherwise, the setting for the next branch of the gain tuning capacitance is considered (1006).

In at least one embodiment, gain tuning capacitance $C_F$ of gain tuning DAC 107 coupled to node 101 (FIG. 4A). In general, a higher gain tuning capacitance $C_G$ reduces the sampling range, while a higher gain tuning capacitance $C_F$ reduces the conversion range. Therefore, calibration of gain tuning capacitance $C_F$ is only useful if starting with a conversion range that is greater than the sampling range. The calibration of gain tuning capacitance $C_F$ starts after calibration of gain tuning capacitance $C_G$ is complete (since it has smaller steps than the conversion range). To ensure that at the end of calibration of gain tuning capacitance $C_G$, the conversion range is larger than the sampling range, the calibration of gain tuning capacitance $C_G$ started with all capacitive branches of gain tuning capacitance $C_G$ enabled, which makes the sampling range much smaller than the conversion range. Then, controller 130 turns off each branch in a corresponding sequential iteration of the loop (e.g., starting with the highest order branch). If the sampling range becomes larger than the conversion range, that disabled branch is enabled. Therefore, at the end of calibration of gain tuning capacitance $C_G$, the calibration error is in the opposite direction (i.e., the sampling range is less than the conversion range by the calibration error). Gain tuning capacitance $C_F$ further reduces the error, but in the same direction (i.e., the sampling range remains less than the conversion range by the calibration error).

Figure 14A:
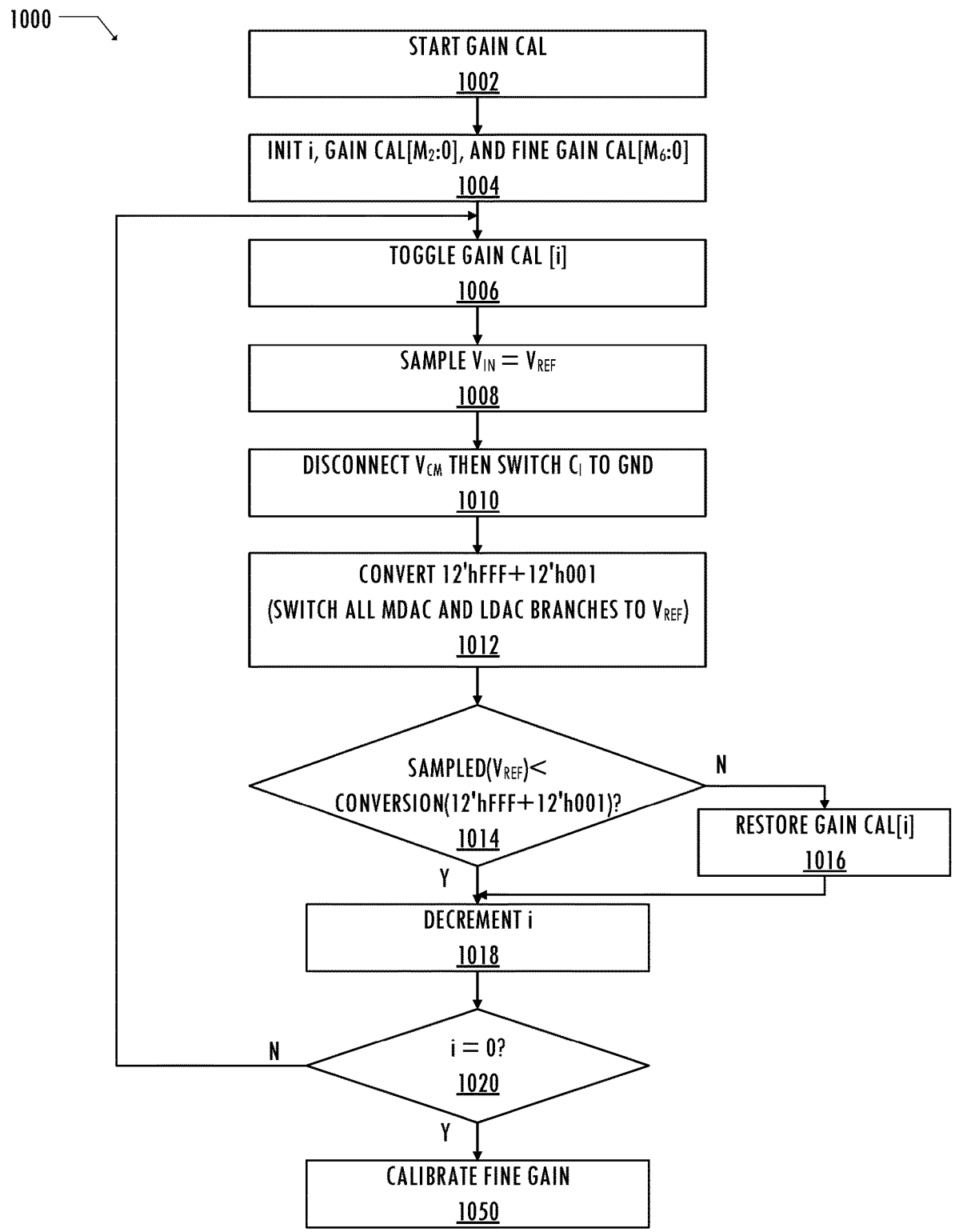
FIG. 14A illustrates information and control flows for calibration of a gain tuning capacitance of the successive-approximation ADC of FIG. 1 consistent with at least one embodiment of the invention.
Figure 14B:
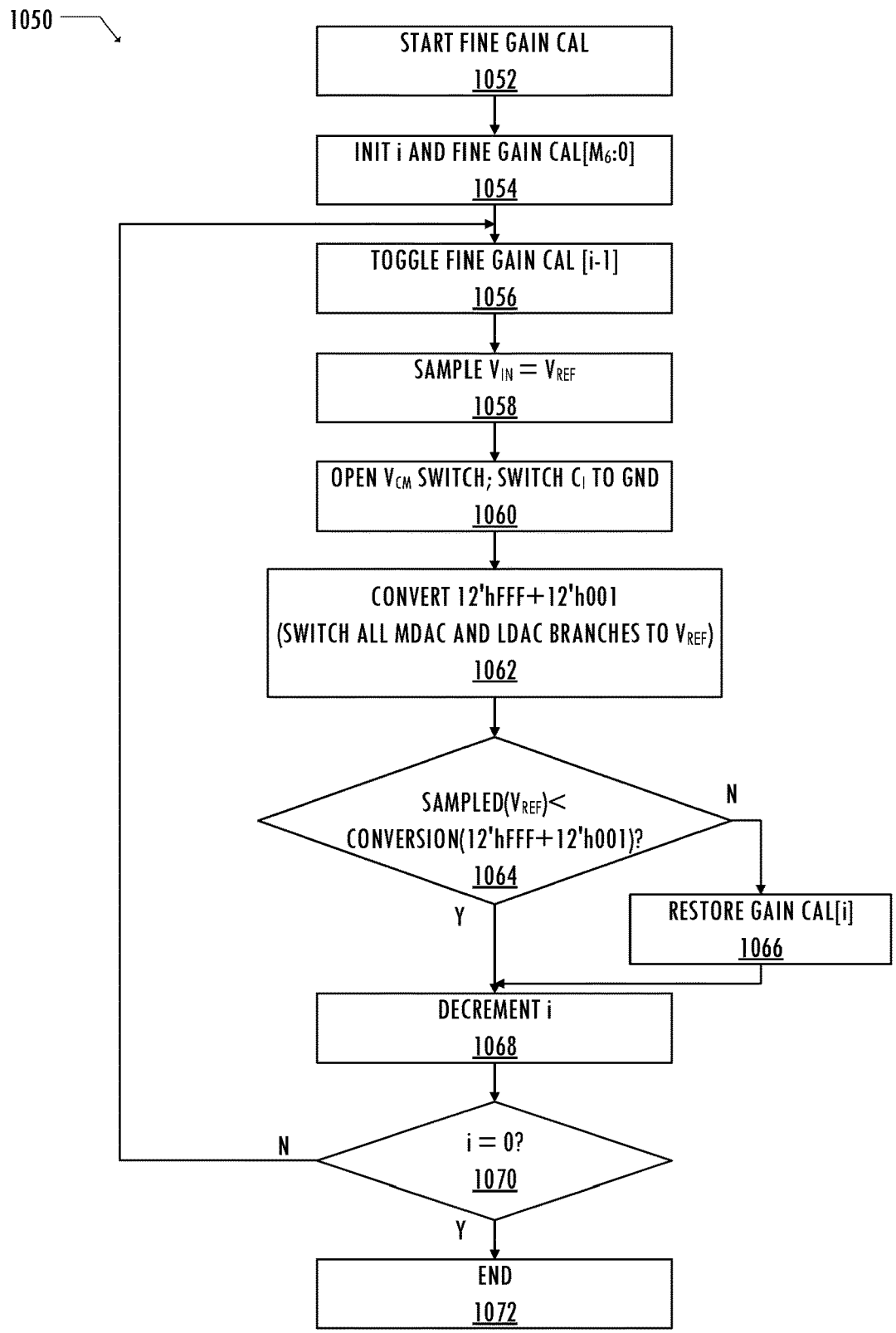
FIG. 14B illustrates information and control flows for calibration of a fine gain tuning capacitance of the successive-approximation ADC of FIG. 1 consistent with at least one embodiment of the invention.

In at least one embodiment, the technique illustrated in FIG. 14B is used to calibrate gain tuning capacitance $C_F$. Controller 130 initializes each bit of digital code FINE GAIN CAL[$M_6$:0] to a predetermined digital value (e.g., '0') and initializes index i to point to the most-significant end of digital code FINE GAIN CAL[$M_6$:0], e.g., i=$M_6$+1, where $M_6$ corresponds to the highest order capacitive branch of fine gain tuning DAC 107 and '0' corresponds to the lowest order capacitive branch of fine gain tuning DAC 107 (1054). Controller 130 tests a setting of fine gain tuning DAC 107, e.g., by toggling bit i−1 of digital code FINE GAIN CAL[$M_6$:0] corresponding to capacitive branch i−1 of fine gain tuning DAC 107 (1056).

Controller 130 couples enabled capacitive branches of fine gain tuning DAC 107 to ground during sampling, sharing, and conversion. Disabled branches (e.g., in the first loop iteration includes all of the branches except for the highest order capacitive branch of fine gain tuning DAC 107) are coupled to analog signal $V_{CM}$ during sampling and then are floated before the sampling ends (1058). Capacitive branches in conversion DAC 104 and offset DAC 122 will be configured according to digital codes OFFSET[$M_4$:0] and NOFFSET[$M_3$:0]. At the end of the sampling phase, node 101 and node 103 are disconnected from analog signal $V_{CM}$ (i.e., floated) and input DAC 102 is disconnected from input analog signal $V_{IN}$ and coupled to ground after being floated for one clock cycle in between to avoid shorting the input to ground (1060). When controller 130 couples the capacitive branches of input DAC 102 to ground, charge sharing occurs. Next, controller 130 floats switches $S_7$ of any enabled capacitive branches in gain tuning DAC 106 and configures switches $S_4$ and $S_6$ in conversion DAC 104 to couple the capacitive branches in MDAC 112 and LDAC 114, including its terminal capacitor, to reference voltage $V_{REF}$ (e.g., for a digital-to-analog conversion of $D_{OUT}$=12'hFFF+12h'001) (1062). For example:

$$V_{DAC} = V_{CM} - V_{REF} \times \frac{C_I}{C_I + C_C + C_G + C_P} + V_{REF} \times \frac{C_C}{C_I + C_C + C_P}.$$

The $V_{DAC}$ input of comparator 108 has an analog value that corresponds to a swing down by sampling of the maximum input analog signal $V_{IN}$ and a swing up by the maximum of the digital-to-analog conversion $V_{DAC}$. If the value of the maximum of the digital-to-analog conversion $V_{DAC}$ is greater than the value of the maximum sampling of the input analog signal $V_{IN}$ (i.e., $V_{DAC} \geq V_P$) (1064), then the conversion range is covering more than the sampling range, the conversion range needs more attenuation, and controller 130 keeps bit i−1 of digital code FINE GAIN CAL[$M_6$:0] set, enabling capacitive branch i−1 of fine gain tuning DAC 107. Otherwise (i.e., $V_{DAC} \leq V_1$) (1064), the conversion range attenuation is more than required, bit i−1 of digital code FINE GAIN CAL[$M_6$:0] is restored to its initialized value (e.g., '0') (1066) and controller 130 determines a next value of index i (e.g., decrements index i) (1068). If the least significant bit of the digital code FINE GAIN CAL[$M_6$:0] has been considered (e.g., i=0) (1070), then calibration of fine gain tuning capacitance $C_F$ is complete and digital code FINE GAIN CAL[$M_6$:0] configures fine gain tuning DAC 107 to calibrate the gain (1072). Otherwise, the setting for the next capacitive branch of fine gain tuning DAC 107 is considered (1056). In at least one embodiment, calibration of the gain tuning capacitances has a target of setting the maximum value of input DAC 102 equal to the maximum value of conversion DAC 104, where the error is less than one least-significant bit of the fine gain tuning capacitance.

In embodiments including gain tuning capacitance $C_{G2}$ of gain tuning DAC 107 coupled to node 105 (FIG. 4B), gain tuning capacitance $C_{G2}$ is calibrated by repeating the steps 1006-1020 of FIG. 14A for FINE GAIN CAL[$M_6$:0] with gain tuning DAC 106 configured according to GAIN CAL [$M_2$:0]. At the end of the calibration of gain tuning capacitance $C_{G2}$, the sampling range is smaller than the conversion range by an amount that is the calibration error.

Figure 14C:
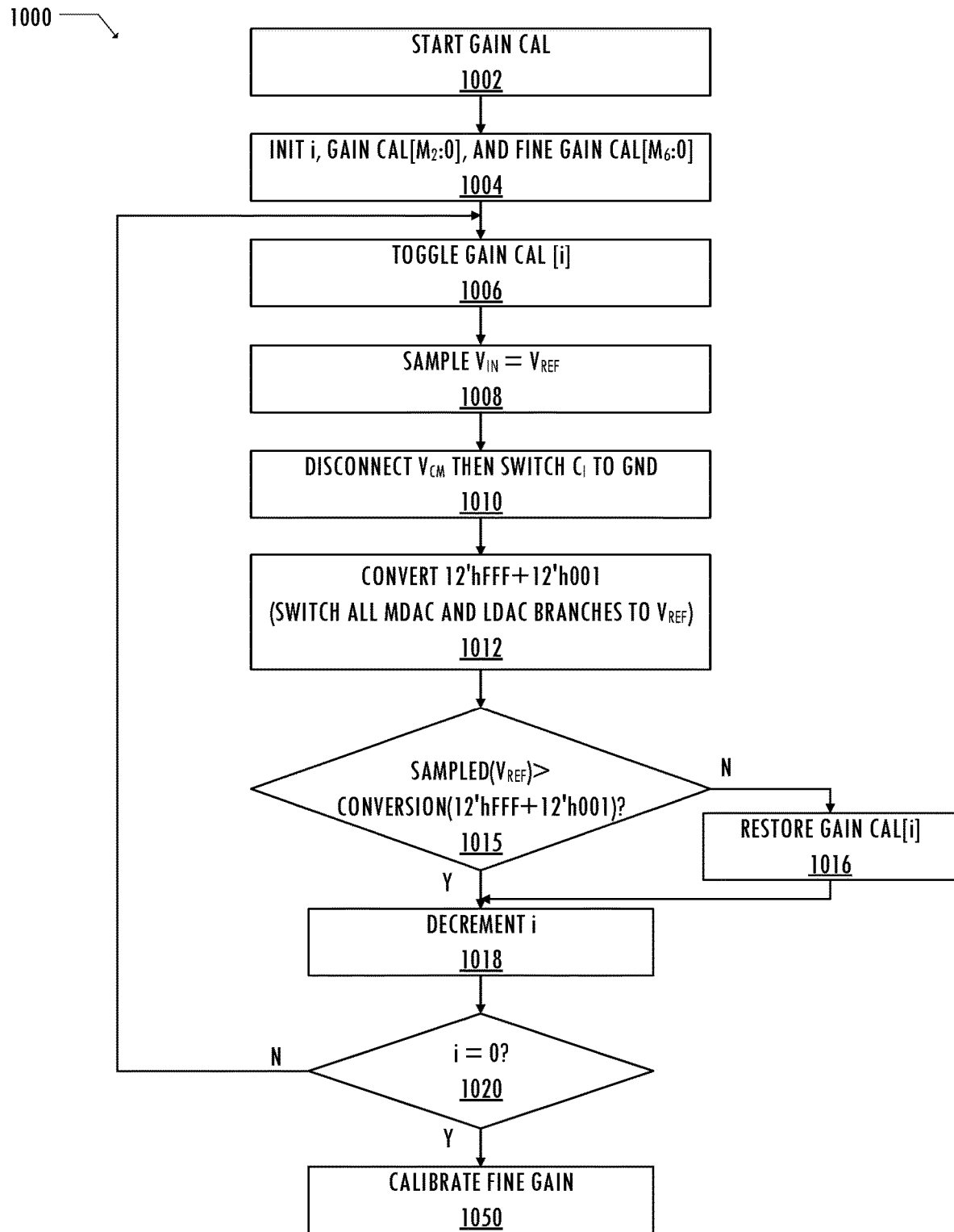
FIG. 14C illustrates information and control flows for another embodiment of calibration of a gain tuning capacitance of the successive-approximation ADC of FIG. 1 consistent with at least one embodiment of the invention.

Referring to FIGS. 1 and 4B, in other embodiments, e.g., embodiments of successive-approximation ADC 100 that couple gain tuning DAC 106 to node 101 and omit any fine gain tuning DAC, or embodiments that couple gain tuning DAC 106 to node 101 and couple fine gain tuning DAC 107 to node 105 (FIG. 4B), the calibration of the gain tuning capacitance $C_G$ or the calibration of gain tuning capacitance $C_G$ and gain tuning capacitance $C_{G2}$ can be performed consistent with the gain calibration technique of 14A, described above or consistent with a modified version of that technique, as illustrated in FIG. 14C. Referring to FIGS. 1, 4B, and 14C, controller 130 starts the gain calibration (1002) and initializes each bit of GAIN CAL[$M_2$:0] and FINE GAIN CAL[$M_6$:0], if present, to zero, and initializes index i to point to the most-significant end of digital code GAIN CAL[$M_2$:0] (e.g., to $M_2$+1) (1004). For each bit of digital code GAIN CAL[$M_2$:0], controller 130 tests the corresponding gain setting by toggling (i.e., setting) bit i−1 of control code GAIN CAL[$M_2$:0] corresponding to capacitive branch i−1 of gain tuning DAC 106 to selectively enable that branch (1006). Controller 130 couples node 101 and node 103 to analog signal $V_{CM}$ and samples the input analog signal $V_{IN}$ (e.g., reference voltage $V_{REF}$ for the unity division mode) (1008). Controller 130 couples enabled capacitive branches of gain tuning capacitance $C_G$ to ground and couples disabled capacitive branches to analog signal $V_{CM}$ during sampling. Those branches are floated before sampling ends. Capacitive branches in conversion DAC 104 and offset DAC 122 will be configured according to digital codes OFFSET [$M_4$:0] and NOFFSET[$M_3$:0].

At the end of the sampling phase, node 101 and node 103 are disconnected from analog signal $V_{CM}$ (i.e., floated) and input DAC 102 is disconnected from input analog signal $V_{IN}$ and coupled to ground, and floated for one clock cycle in between to avoid shorting the input to ground (1010). Then, controller 130 floats switches $S_7$ of those capacitive branches enabled in gain tuning DAC 106, causing those branches to float and configures switches $S_4$ and $S_6$ of conversion DAC 104 to couple the capacitive branches in MDAC 112 and LDAC 114, including its terminal capacitance, to reference voltage $V_{REF}$ (e.g., for a digital-to-analog conversion of $D_{OUT}$=12'hFFF+12'h001) (1012). Next, controller 130 determines whether enabling the capacitive branch makes the conversion range greater than the sampling range (1015). If enabling a capacitive branch of gain tuning DAC 106 makes the conversion range greater than the sampling range, that is, the sampling range is not greater than the conversion range, then controller 130 disables that capacitive branch again by clearing (i.e., restoring) the corresponding bit of GAIN CAL[$M_2$:0] (1016); otherwise, that capacitive branch remains enabled (i.e., the corresponding bit of GAIN CAL[$M_2$:0] remains set). If all settings of gain tuning capacitance $C_G$ have not yet been tested (1020), then the setting for the next branch of the gain tuning capacitance is considered (1006). Otherwise, at the end of the gain tuning capacitance calibration, the sampling range will be larger than but as close to the conversion range as realizable by the step size of gain tuning DAC 106. Controller 130 then proceeds to calibrate fine gain tuning capacitance $C_F$, if present, and may determine digital code FINE GAIN CAL[$M_6$:0] (1050) using the same technique of FIG. 14C.

In at least one embodiment, a combination of gain tuning capacitance $C_G$, gain tuning capacitance $C_{G2}$ coupled to node 105, and fine gain tuning capacitance $C_F$ coupled to node 101 are used. For example, gain tuning capacitance $C_G$ has the largest steps, gain tuning capacitance $C_F$ has the next largest steps, and gain tuning capacitance $C_{G2}$ has the smallest steps. An additional digital code FINE GAIN CAL[$M_7$:0] (not shown) is included in controller 130 and the gain calibration technique is adapted to calibrate all three gain tuning capacitances to further reduce the error (e.g., calibrating each gain tuning capacitance $C_G$, $C_F$, and $C_{G2}$ in an order of largest step size to smallest step size). For example, at the beginning of the gain calibration when the gain calibration registers are initialized, controller 130 sets digital code GAIN CAL[$M_2$:0] to all ones and sets digital code FINE GAIN CAL [$M_6$:0] to all zeros, as described above. In addition, controller 130 sets the additional digital code FINE GAIN CAL [$M_7$:0] to all ones. Next, controller 130 performs gain calibration to determine digital code GAIN CAL[$M_2$:0] and digital code FINE GAIN CAL [$M_6$:0], as described before. After calibrating fine gain tuning capacitance $C_F$, controller 130 calibrates the additional fine gain tuning capacitance $C_{G2}$ and determines digital code FINE GAIN CAL [$M_7$:0] in the same way as gain tuning capacitance $C_G$ was calibrated to determine digital code GAIN CAL[$M_2$:0].

Figure 15A:
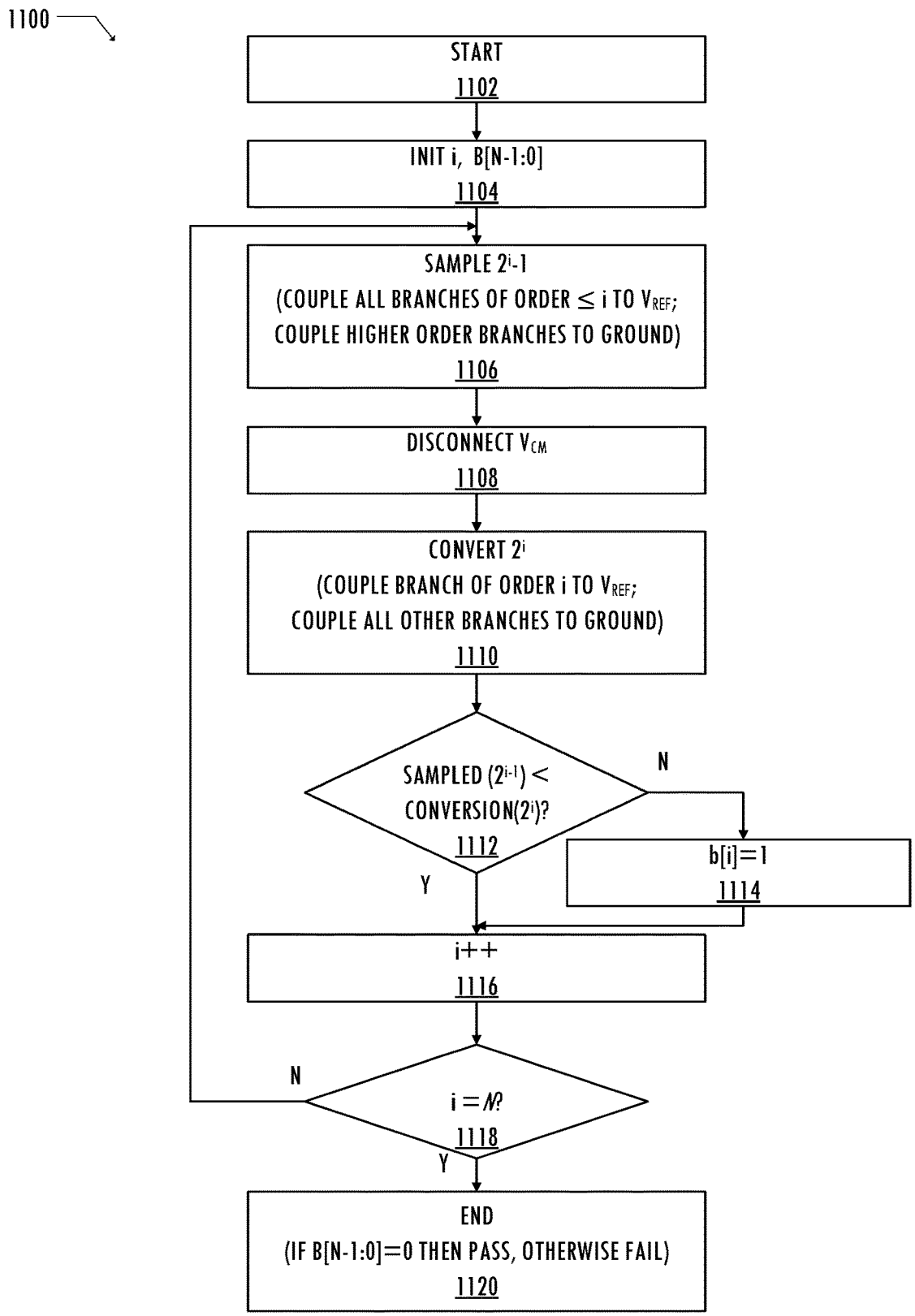
FIGS. 15A and 15B illustrate information and control flows and timing waveforms for a monotonicity test of the successive-approximation ADC of FIG. 1 consistent with at least one embodiment of the invention.
Figure 15B:
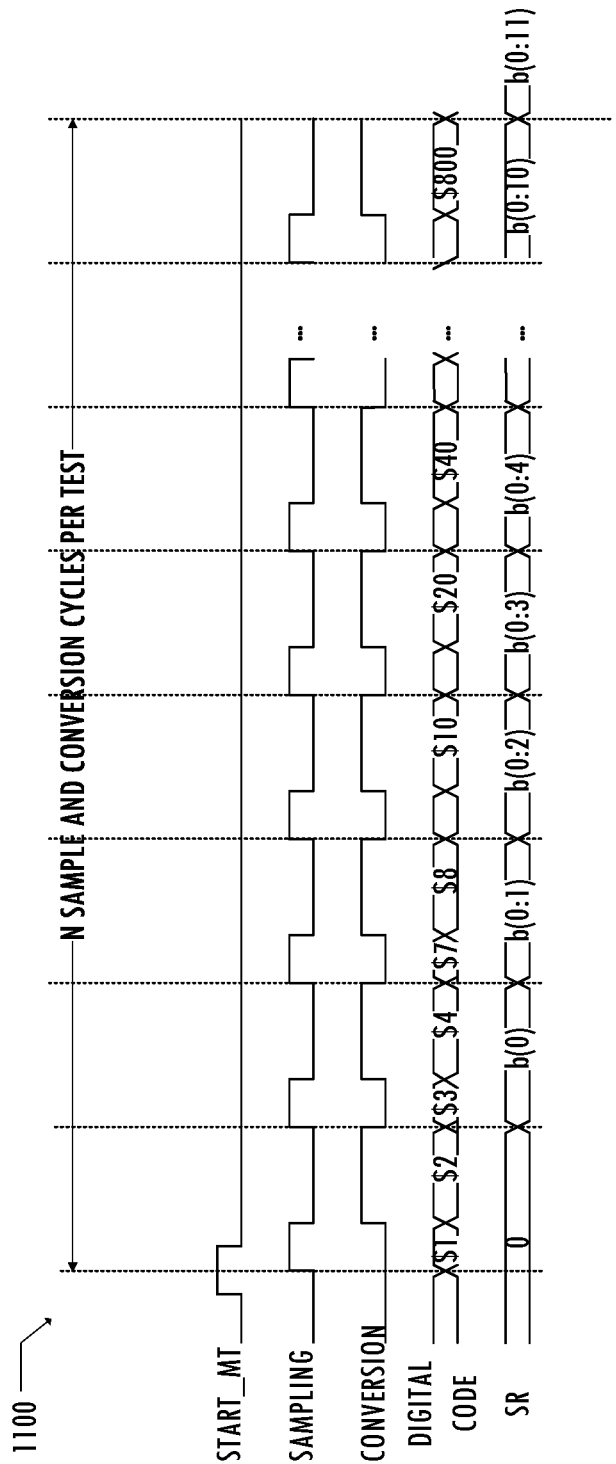

Referring to FIGS. 1, 15A, and 15B, monotonicity test 1100 determines monotonicity of conversion DAC 104 for successive-approximation ADC 100. For example, monotonicity test 1100 determines whether the output of conversion DAC 104 is monotonic for transitions of digital code $D_{OUT}$[N−1:0] from a first code having least-significant bits set and all other bits in a reset state to a second code for the next adjacent increasing value. In at least one embodiment, the test determines whether transition from 12'b000000000001 to 12'b000000000010, transition from 12'b 000000000011 to 12'b000000000100, transition from 12'b000000000111 to 12'b000000001000, . . . , and transition from 12'b011111111111 to 12'b100000000000 are monotonic. Controller 130 updates digital code $D_{OUT}$ to sequence through the transition values of interest (e.g., sequences through 12'b 000000000001 to 12'b000000000010, transition from 12'b000000000011 to 12'b000000000100, transition from 12'b000000000111 to 12'b000000001000, transition from 12'b011111111111 to 12'b100000000000). In at least one embodiment, bridge tuning DAC 116 is configured according to a value of digital code BRIDGE CAL[$M_5$:0], offset DAC 122 is configured according to a default value of digital code NOFFSET[$M_3$:0], conversion DAC 104 is configured according to a default value of digital code OFFSET[$M_4$:0] to set MDAC 112 and LDAC 114 during sampling and $D_{OUT}$ used to set MDAC 112 and LDAC 114 during conversion, gain tuning DAC 106 is configured according to a default value of digital code GAIN CAL[$M_2$:0], and fine gain tuning DAC 107 is configured according to a default value of digital code FINE GAIN CAL [$M_6$:0].

In at least one embodiment of monotonicity test 1100, controller 130 starts the monotonicity test 1100 after bridge capacitor calibration 900 (1102). For example, controller 130 initializes index i, which may be used to index a bit corresponding to a transition being tested, e.g., the least-significant bit to the next least-significant bit that is set in the first code of the transition. A digital code b[N−1:0] may be used to track transitions that fail the monotonicity test and may benefit from monotonicity tuning described above. Controller 130 initializes each bit of digital code b[N−1:0] to a predetermined value (e.g., '0') (1104). Controller 130 can float input capacitance $C_I$, fine gain tuning capacitance $C_F$, and coarse gain tuning capacitance $C_G$ since they will not affect the monotonicity test results. Floating those capacitances improves signal swing at node 101 and thus improves performance of the monotonicity test. Controller 130 configures switches $S_1$, $S_2$, and $S_3$ to couple node 101 and node 103 to analog signal $V_{CM}$. Controller 130 configures conversion DAC 104 to sample a charge using digital code $D_{OUT}$ set to a first value, e.g., a value that has i+1 least-significant bits set (e.g., 2'b 000000000001) causing all lower significant branches to be coupled to reference voltage $V_{REF}$ and higher significant branches to be coupled to ground (1106). Successive-approximation ADC 100 stores the sampled charge on a capacitance of a sample-and-hold circuit that may include conversion DAC 104. Then, controller 130 configures switches $S_1$, $S_2$, and $S_3$ to decouple node 101 from analog signal $V_{CM}$ (1108). Next, controller 130 configures conversion DAC 104 to use the sampled charge to perform a digital-to-analog conversion of digital code $D_{OUT}$ set to a second value, e.g., the next adjacent increasing value, i.e., the next least-significant bit being set and all others of the bits being reset, coupling the branch corresponding to the next least-significant bit of conversion DAC 104 to reference voltage $V_{REF}$ and coupling all other branches of the conversion DAC 104 to ground (1110).

If the voltage comparison indicates that voltage $V_{DAG}$ on node 101 is not greater than voltage $V_P$ on node 103 (i.e., $V_{DAG} < V_P$) (1112), then controller 130 indicates that the transition is not monotonic and toggles bit b[i] (e.g., sets b[i]) (1114). Controller 130 increments index i (1116) and if the (N−1)th transition has not been evaluated yet (1118), controller 130 configures successive-approximation ADC 100 to test the next transition of the set of (N−1)th worst-case transitions (1106). If the (N−1)th transition has been evaluated (1118), monotonicity test 1100 ends (1120). If the voltage comparison indicates that analog signal $V_{DAG}$ on node 101 is greater than analog signal $V_P$ on node 103 (i.e., $V_{DAG} > V_P$) (1112), then controller 130 indicates that the transition is monotonic (e.g., b[i] remains clear) (1114), increments index i (1116). If the (N−1)th transition has not been evaluated yet (1118), controller 130 configures successive-approximation ADC 100 to test the next transition of the (N−1)th worst-case transitions. If the (N−1)th transition has been evaluated (1118), monotonicity test 1100 ends (1120). If any bit of digital code b[N−1:0] is set, then a branch of the corresponding transition is not monotonic and indicates which branches may be calibrated using a monotonicity tuning DAC, described above, or a failure indication provided. If all bits of digital code b[N−1:0] are clear, then successive-approximation ADC 100 passes the monotonicity test. Note that the monotonicity test can be performed using other sequences, e.g., a larger value used during sampling and a smaller value used during conversion. The expected output of the comparator will have opposite polarity. Monotonicity test 1100 utilizes the ability of successive-approximation ADC 100 to sample and compare and reuses its hardware and a trivial amount of additional control logic to self-test. Monotonicity test 1100 is applicable to successive-approximation ADC 100 and to other conventional successive-approximation ADCs (e.g., successive-approximation ADCs with only a sampling phase and a conversion phase, but no charge-sharing phase). Although monotonicity test 1100 is described using worst-case transitions, monotonicity test 1100 may be adapted to evaluate all transitions of digital code $D_{OUT}$ or other sets of transitions.

Information and control flows of FIGS. 11-15A are exemplary only and controller 130 may calibrate and perform diagnostics for successive-approximation ADC 100 according to other information and control flows that do not change data dependencies. In addition, comparator readings made during calibration of FIGS. 12-14 can be repeated and averaged for increased accuracy and to reduce or eliminate effects of settling errors. Other embodiments of the calibration and testing techniques described above use other combinations of at least one bridge capacitance calibration, gain tuning capacitance calibration, and offset capacitance calibration. In addition, monotonicity testing can be used independently from bridge capacitance calibration, gain tuning capacitance calibration, and offset capacitance calibration.

Structures described herein may be implemented using a finite-state machine or software executing on a processor (which includes firmware) or by a combination of software and hardware. Software, as described herein, may be encoded in at least one tangible (i.e., non-transitory) computer readable medium. As referred to herein, a tangible computer-readable medium includes at least a disk, tape, or other magnetic, optical, or electronic storage medium (e.g., read-only memory, random access memory, etc.).

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative and is not intended to limit the scope of the invention as set forth in the following claims. For example, while the calibration and testing techniques have been described for specific embodiments of a successive-approximation ADC, one of skill in the art will appreciate that the teachings herein can be utilized by other ADCs or DACs. While the successive-approximation ADC is described with reference to multiple voltage domains, the teachings herein can be adapted to embodiments having only one voltage domain. Although described using embodiments of circuits that are single-ended, differential circuits may be used. Moreover, while the successive-approximation ADC has been described as using binary searching techniques, one of skill in the art will appreciate that the teachings herein can be adapted to thermal coding techniques. The terms "first," "second," "third," and so forth, as used in the claims, unless otherwise clear by context, is to distinguish between different items in the claims and does not otherwise indicate or imply any order in time, location or quality. Variations and modifications of the embodiments disclosed herein may be made based on the description set forth herein, without departing from the scope of the invention as set forth in the following claims.

What is claimed is:

1. A method for calibrating a successive-approximation analog-to-digital converter (ADC), the method comprising:
   configuring the successive-approximation ADC in a calibration mode of operation; and
   while in the calibration mode of operation, the method further comprises:
      determining a digital code corresponding to a programmable capacitance of the successive-approximation ADC; and
      storing the digital code corresponding to the programmable capacitance in a storage element of an integrated circuit die including the successive-approximation ADC.

2. The method, as recited in claim 1, further comprising:
   sampling a predetermined voltage level during a sampling phase to generate a sampled voltage;
   redistributing charge according to a predetermined digital code by a charge-redistribution digital-to-analog converter (DAC) to generate a scaled voltage level during a conversion phase, the predetermined digital code corresponding to an expected output of the successive-approximation ADC in response to the predetermined voltage level;
   comparing the sampled voltage to the scaled voltage level to generate a digital signal; and
   using the digital signal to generate the digital code corresponding to the programmable capacitance.

3. The method, as recited in claim 2, wherein the predetermined voltage level is based on a reference voltage coupled to selected branches of the charge-redistribution DAC corresponding to the predetermined digital code, a predetermined input analog signal coupled to a sampling capacitance during the sampling, or a combination thereof.

4. The method, as recited in claim 1, further comprising:
   initializing a value of each bit of the digital code corresponding to the programmable capacitance to a predetermined digital value, the digital code corresponding to the programmable capacitance having N bits, where N is an integer greater than zero;
   for each bit of the N bits of the digital code corresponding to the programmable capacitance, the method further comprises:
      toggling the value of the bit;
      sampling a predetermined voltage level during a sampling phase to generate a sampled voltage;
      redistributing charge according to the digital code corresponding to the programmable capacitance by a charge-redistribution digital-to-analog converter (DAC) to generate a scaled voltage level during a conversion phase;
      comparing the sampled voltage to the scaled voltage level to generate a digital signal; and maintaining the value of the bit or restoring the value of the bit to the predetermined digital value based on the digital signal.

5. The method, as recited in claim 1, further comprising:
prior to determining the digital code corresponding to the programmable capacitance, determining whether calibration is needed or a type of the programmable capacitance based on a conversion of a predetermined analog input to an expected digital signal.

6. The method, as recited in claim 1, wherein while in the calibration mode of operation, the method further comprises:
determining a second digital code corresponding to a second programmable capacitance of the successive-approximation ADC, the second programmable capacitance providing finer accuracy than the programmable capacitance; and
storing the second digital code corresponding to the second programmable capacitance in a second storage element of the integrated circuit die including the successive-approximation ADC.

7. The method, as recited in claim 1, wherein the programmable capacitance is a gain tuning capacitance, a bridge tuning capacitance, an offset capacitance, or a monotonicity tuning capacitance.

8. The method, as recited in claim 1, wherein the programmable capacitance is a gain tuning capacitance and the digital code sets the gain tuning capacitance to a value that equates a first maximum value of an input signal to a second maximum value of a charge-redistribution digital-to-analog converter included in the successive-approximation ADC.

9. The method, as recited in claim 1, wherein the programmable capacitance is an offset capacitance corresponding to the programmable capacitance and the digital code sets the offset capacitance to a value that cancels any offset of the successive-approximation ADC.

10. The method, as recited in claim 1, wherein the programmable capacitance is a bridge tuning capacitance and the digital code sets the bridge tuning capacitance to cause a first conversion value of all branches of a first DAC and a lowest order capacitive branch of a second DAC to be less than a second conversion value of two lowest order capacitive branches of the second DAC.

11. The method, as recited in claim 10, wherein the digital code corresponding to the programmable capacitance guarantees that a voltage output by a charge-redistribution digital-to-analog converter corresponding to a second digital code that enables all capacitances coupled to a first plate of a bridge capacitor, sets a lowest order capacitance coupled to a second plate of the bridge capacitor, and disables all others of the capacitances, is less than a second voltage output by the charge-redistribution digital-to-analog converter corresponding to a third digital code that resets the lowest order capacitance and enables a next lowest order capacitance coupled to the second plate of the bridge capacitor.

12. The method, as recited in claim 1, further comprising:
configuring the successive-approximation ADC in a conversion mode of operation; and
while in the conversion mode of operation, operating the successive-approximation ADC to convert an analog input signal to a digital output signal using the programmable capacitance configured using the digital code corresponding to the programmable capacitance.

13. The method, as recited in claim 1, further comprising:
configuring the successive-approximation ADC in a diagnostic mode of operation; and
while in the diagnostic mode of operation, determining whether a charge-redistribution digital-to-analog converter of the successive-approximation ADC is monotonic.

14. The method, as recited in claim 13, further comprising:
calibrating a monotonicity tuning capacitance in response to determining that the charge-redistribution digital-to-analog converter of the successive-approximation ADC is not monotonic.

15. The method, a recited in claim 1, further comprising:
forming the integrated circuit die including the successive-approximation ADC.

16. The successive-approximation analog-to-digital converter formed by the method of claim 1.

17. A successive-approximation analog-to-digital converter (ADC) comprising:
an input capacitance coupled to a first node and configured to store a sampled input charge based on an input analog signal during a first phase of an analog-to-digital conversion;
a gain tuning capacitance configured to store a first portion of the sampled input charge during a second phase of the analog-to-digital conversion and to sequester the first portion during a third phase of the analog-to-digital conversion;
a charge-redistribution digital-to-analog converter coupled to the first node and comprising a conversion capacitor configured to store a second portion of the sampled input charge during the second phase of the analog-to-digital conversion and configured to use the second portion, a remaining portion of the sampled input charge, and a reference voltage to provide an analog signal on the first node corresponding to a digital output code approximating the input analog signal at an end of the third phase of the analog-to-digital conversion; and
control logic configured to generate switch control signals to operate the successive-approximation ADC in a calibration mode to generate a gain tuning code for determining the gain tuning capacitance.

18. The successive-approximation ADC as recited in claim 17, further comprising:
a first storage element configured to store a second digital code corresponding to a ratio of the input capacitance to a total available sampling capacitance; and
a second storage element configured to store the gain tuning code, the second digital code and the gain tuning code being predetermined during the calibration mode,
wherein the control logic is further configured to generate the switch control signals to operate the successive-approximation analog-to-digital converter in a conversion mode of operation to generate the digital output code using the gain tuning code.

19. A successive-approximation analog-to-digital converter (ADC) comprising:
means for storing a sampled input charge based on an input analog signal in a first phase of an analog-to-digital conversion;
means for generating an adjusted charge according to a gain tuning code during a second phase of the analog-to-digital conversion;
means for using the adjusted charge and a reference voltage to provide an analog signal corresponding to a digital output code approximating the input analog signal in a third phase of the analog-to-digital conversion; and means for controlling the successive-approximation ADC, wherein in a first mode of operation, the means for controlling causes the successive-approximation ADC to generate a digital code corresponding to a programmable capacitance of the successive-approximation ADC, and wherein in a second mode of operation, the means for controlling causes the successive-approximation analog-to-digital converter to perform the analog-to-digital conversion using the programmable capacitance configured according to the digital code corresponding to the programmable capacitance.

20. The successive-approximation ADC as recited in claim 19, wherein in a third mode of operation, the means for controlling causes the successive-approximation analog-to-digital converter to perform monotonicity testing using the programmable capacitance configured according to the digital code corresponding to the programmable capacitance.

* * * * *